(12) United States Patent
Kim et al.

(10) Patent No.: US 11,700,737 B2
(45) Date of Patent: Jul. 11, 2023

(54) LIGHT-EMITTING DEVICE AND APPARATUS INCLUDING THE SAME

(71) Applicant: Samsung Display Co., Ltd., Yongin-si (KR)

(72) Inventors: Dongchan Kim, Yongin-si (KR); Jiyoung Moon, Yongin-si (KR); Donghui Lee, Yongin-si (KR); Jihye Lee, Yongin-si (KR); Chulsoon Lee, Yongin-si (KR); Hakchoong Lee, Yongin-si (KR); Haemyeong Lee, Yongin-si (KR); Wonsuk Han, Yongin-si (KR); Jihwan Yoon, Yongin-si (KR); Yoonhyeung Cho, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 302 days.

(21) Appl. No.: 16/895,842

(22) Filed: Jun. 8, 2020

(65) Prior Publication Data
US 2021/0104707 A1 Apr. 8, 2021

(30) Foreign Application Priority Data
Oct. 4, 2019 (KR) .................. 10-2019-0123351

(51) Int. Cl.
*H01L 51/52* (2006.01)
*H10K 50/19* (2023.01)
(Continued)

(52) U.S. Cl.
CPC ............ *H10K 50/19* (2023.02); *H10K 50/13* (2023.02); *H10K 59/123* (2023.02); *H10K 59/38* (2023.02);
(Continued)

(58) Field of Classification Search
CPC ............ H01L 51/5278; H01L 27/322; H01L 27/3248; H01L 51/504; H01L 51/0052; H01L 51/0058
(Continued)

(56) References Cited

U.S. PATENT DOCUMENTS 7,560,862 B2  7/2009  Liao et al.
9,755,176 B2  9/2017  Lee
(Continued)

FOREIGN PATENT DOCUMENTS

EP    3561875 A1    10/2019
KR    10-1003130 B1  12/2010
(Continued)

OTHER PUBLICATIONS

G. Parthasarathy, "Lithium doping of semiconducting organic charge transport materials," J. App. Phys., vol. 89, No. 9, May 1, 2001, pp. 4986-4992.

*Primary Examiner* — Dzung Tran
(74) *Attorney, Agent, or Firm* — Lewis Roca Rothgerber Christie LLP

(57) ABSTRACT

A light-emitting device includes: a first electrode; a second electrode facing the first electrode; light-emitting units in the number of n between the first electrode and the second electrode; and a charge-generation unit(s) in the number of n−1 between the adjacent light-emitting units. The light-emitting units each include an emission layer, and at least one of the charge-generation unit(s) includes an n-type charge-generation layer, a p-type charge-generation layer, and an interlayer between the n-type charge-generation layer and the p-type charge-generation layer. The p-type charge-generation layer includes a first material and a second material, the first material includes a hole-transporting organic compound, an inorganic insulation compound, or any combination thereof, the second material includes at
(Continued)

least one inorganic semiconductor compound, the interlayer comprises a third material, and the third material is selected from an organic compound, an inorganic semiconductor compound, and an inorganic insulation compound.

17 Claims, 3 Drawing Sheets

(51) Int. Cl.
*H10K 50/13* (2023.01)
*H10K 59/38* (2023.01)
*H10K 59/123* (2023.01)
*H10K 50/15* (2023.01)
*H10K 50/16* (2023.01)
*H10K 50/17* (2023.01)
*H10K 71/00* (2023.01)
*H10K 85/30* (2023.01)
*H10K 85/60* (2023.01)
*H10K 101/30* (2023.01)
*H10K 102/00* (2023.01)

(52) U.S. Cl.
CPC ............. *H10K 50/15* (2023.02); *H10K 50/16* (2023.02); *H10K 50/17* (2023.02); *H10K 50/171* (2023.02); *H10K 71/00* (2023.02); *H10K 85/30* (2023.02); *H10K 85/322* (2023.02); *H10K 85/615* (2023.02); *H10K 85/626* (2023.02); *H10K 85/633* (2023.02); *H10K 85/636* (2023.02); *H10K 85/654* (2023.02); *H10K 85/6572* (2023.02); *H10K 85/6574* (2023.02); *H10K 2101/30* (2023.02); *H10K 2102/331* (2023.02); *H10K 2102/351* (2023.02)

(58) Field of Classification Search
USPC .......................................................... 257/40
See application file for complete search history.

(56) References Cited

U.S. PATENT DOCUMENTS

| | | |
|---|---|---|
| 10,158,095 B2 | 12/2018 | Kim et al. |
| 10,181,572 B2 | 1/2019 | Kim et al. |
| 10,483,327 B2 | 11/2019 | Kim et al. |
| 10,636,350 B2 | 4/2020 | Kim et al. |
| 2006/0087225 A1* | 4/2006 | Liao ................... H01L 51/5278 313/504 |
| 2006/0172147 A1* | 8/2006 | Matsuura ............ H01L 51/5036 428/917 |
| 2009/0001878 A1 | 1/2009 | Qiu et al. |
| 2011/0240971 A1* | 10/2011 | Nowatari ............ H01L 51/0078 257/40 |
| 2014/0175418 A1* | 6/2014 | Ushikubo ............ H01L 51/5072 257/40 |
| 2016/0005991 A1* | 1/2016 | Lee ..................... H01L 51/5044 257/40 |
| 2016/0043146 A1* | 2/2016 | Uesaka ............... H01L 51/5024 257/40 |
| 2017/0263876 A1* | 9/2017 | Kim .................... H01L 51/5076 |

FOREIGN PATENT DOCUMENTS

| | | |
|---|---|---|
| KR | 10-1232766 B1 | 2/2013 |
| KR | 10-2016-0004455 A | 1/2016 |
| KR | 10-2016-0103596 A | 9/2016 |
| KR | 10-2018-0094535 A | 8/2018 |
| KR | 10-2018-0105293 A | 9/2018 |
| KR | 10-1894332 B1 | 9/2018 |
| KR | 10-2019-0034381 A | 4/2019 |

* cited by examiner

LIGHT-EMITTING DEVICE AND APPARATUS INCLUDING THE SAME

CROSS-REFERENCE TO RELATED APPLICATION

This application claims priority to and the benefit of Korean Patent Application No. 10-2019-0123351, filed on Oct. 4, 2019, in the Korean Intellectual Property Office, the entire content of which is incorporated herein by reference.

BACKGROUND

1. Field

One or more aspects of embodiments of the present disclosure relate to a light-emitting device and an apparatus including the same.

2. Description of Related Art

A light-emitting device may convert electrical energy into light energy. Examples of such light-emitting device include an organic light-emitting device using an organic material for an emission layer, a quantum-dot light-emitting device using a quantum dot for an emission layer, and/or the like.

In a light-emitting device, a first electrode is positioned on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. The holes and the electrons, which are carriers, may then recombine in the emission layer to produce excitons. These excitons transition from an excited state to a ground state, thereby generating light.

SUMMARY

One or more aspects of embodiments of the present disclosure are directed toward a tandem light-emitting device including an interlayer in a charge-generation unit and an apparatus including the same.

Additional aspects will be set forth in part in the description which follows and, in part, will be apparent from the description, or may be learned by practice of the presented embodiments of the disclosure.

According to an embodiment, a light-emitting device includes: a first electrode; a second electrode facing the first electrode; light-emitting units in the number of n between the first electrode and the second electrode; and a charge-generation unit(s) in the number of n−1 between the adjacent light-emitting units, wherein n may be a natural number of 2 or more, the light-emitting units may each independently include an emission layer, and at least one of the charge-generation unit(s) may include an n-type charge-generation layer, a p-type charge-generation layer, and an interlayer between the n-type charge-generation layer and the p-type generation layer, wherein the p-type charge-generation layer may include a first material and a second material, the first material including a hole-transporting organic compound, an inorganic insulation compound, or any combination thereof, and the second material including at least one selected from inorganic semiconductor compounds, wherein the interlayer may consist of a third material, the third material being selected from an organic compound, an inorganic semiconductor compound, and an inorganic insulation compound.

In one embodiment, the volume of the first material may be equal or greater than that of the second material.

In one embodiment, the first material may include a hole-transporting organic compound, and a volume ratio of the first material to the second material may be in a range of about 99:1 to about 80:20, or the first material may include an inorganic insulation compound, and a volume ratio of the first material to the second material may be in a range of about 99:1 to about 50:50.

In one embodiment, the third material may be an organic compound.

In one embodiment, a band gap of the third material may be about 2.5 eV or more.

In one embodiment, a lowest unoccupied molecular orbital (LUMO) energy level of the third material may be about −4.5 eV to about −6.5 eV.

In one embodiment, the n-type charge-generation layer may include a fourth material and a fifth material, wherein the fourth material may include alkali metal, alkaline earth metal, lanthanoid metal, transition metal, late transition metal, or any combination thereof, and the fifth material may include at least one selected from electron-transporting organic compounds.

In one embodiment, a LUMO energy level of the fifth material may be smaller than the LUMO energy level of the third material.

In one embodiment, a difference between the LUMO energy level of the fifth material and the LUMO energy level of the third material may be about 1 eV or less.

In one embodiment, the first electrode may be an anode, the second electrode may be a cathode, and the light-emitting device may include: an $n^{th}$ light-emitting unit between the first electrode and the second electrode; an $n-1^{th}$ light-emitting unit between the first electrode and the $n^{th}$ light-emitting unit; and an $n-1^{th}$ charge-generation unit between the $n^{th}$ light-emitting unit and the $n-1^{th}$ light-emitting unit, wherein the $n^{th}$ light-emitting unit may include an $n^{th}$ emission layer and the $n^{th}$ light-emitting unit may include an $n-1^{th}$ emission layer; an $n-1^{th}$ hole transport region may be between the first electrode and the $n-1^{th}$ emission layer; an $n-1^{th}$ electron transport region may be between the $n-1^{th}$ emission layer and the $n-1^{th}$ charge-generation unit; an $n^{th}$ hole transport region may be between the $n-1^{th}$ charge-generation unit and the $n^{th}$ emission layer; and an $n^{th}$ electron transport region may be between the $n^{th}$ emission layer and the second electrode, the plurality of hole transport regions may each independently include a hole injection layer, a hole transport layer, an electron blocking layer, or any combination thereof, and the plurality of electron transport regions may each independently include a hole blocking layer, an electron transport layer, an electron injection layer, or any combination thereof.

In one embodiment, the hole injection layer may include a sixth material and a seventh material, wherein the sixth material and the seventh material may be different from each other, the sixth material may include a halide of lanthanoid metal, a halide of transition metal, a halide of late transition metal, tellurium, a telluride of lanthanoid metal, a telluride of transition metal, a telluride of late transition metal, a selenide of lanthanoid metal, a selenide of transition metal, a selenide of late transition metal, or any combination thereof, and the seventh material may include a hole-transporting organic compound, a halide of alkali metal, a halide of alkaline earth metal, a halide of lanthanoid metal, or any combination thereof.

In one embodiment, the seventh material may include at least one selected from a hole-transporting organic compound, and a volume ratio of the sixth material to seventh material may be in a range of about 1:99 to about 20:80, or the seventh material may include a halide of alkali metal, a halide of alkaline earth metal, a halide of lanthanoid metal, or any combination thereof, and a volume ratio of the sixth material to the seventh material may be in a range of about 1:99 to about 50:50.

In one embodiment, the electron injection layer may include an eighth material, and the eighth material may include a halide of alkali metal, a halide of alkaline earth metal, a halide of lanthanoid metal, or any combination thereof.

In one embodiment, the electron injection layer may consist of the eighth material.

In one embodiment, the electron injection layer may further include a ninth material, the eighth material and the ninth material may be different from each other, and the ninth material may include alkali metal, alkaline earth metal, lanthanoid metal, or any combination thereof.

In one embodiment, the eighth material may be represented by Formula X, and the ninth material may be represented by Formula Y:

$A_nB_m$     Formula X

C.     Formula Y

In Formulae X and Y,

A and C may each independently include alkali metal, alkaline earth metal, lanthanoid metal, or any combination thereof, B may be halogen, n and m may each independently be an integer of 1 or more such that the eighth material is neutral, and A and C may be different from each other.

In one embodiment, the hole transport layer may be in direct contact with the emission layer, the hole transport layer may include a tenth material and an eleventh material, the tenth material and the eleventh material may be different from each other, the tenth material may include at least one selected from hole-transporting organic compounds, and the eleventh material may include a halide of alkali metal, a halide of alkaline earth metal, a halide of lanthanoid metal, or any combination thereof.

In one embodiment, the electron transport layer may be in direct contact with the emission layer, the electron transport layer may include a twelfth material and a thirteenth material, the twelfth material and the thirteenth material may be different from each other, the twelfth material may include at least one selected from electron-transporting organic compounds, the thirteenth material may include a halide of alkali metal, a halide of alkaline earth metal, a halide of lanthanoid metal, or any combination thereof.

According to another embodiment, provided is an apparatus including: a thin film transistor including a source electrode, a drain electrode, and an activation layer; and the light-emitting device, wherein a first electrode of the light-emitting device and at least one of the source electrode and the drain electrode of the thin film transistor may be electrically connected to each other.

In one embodiment, the apparatus may further include a color filter, and the color filter may be on a path along which light of the light-emitting device is output.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
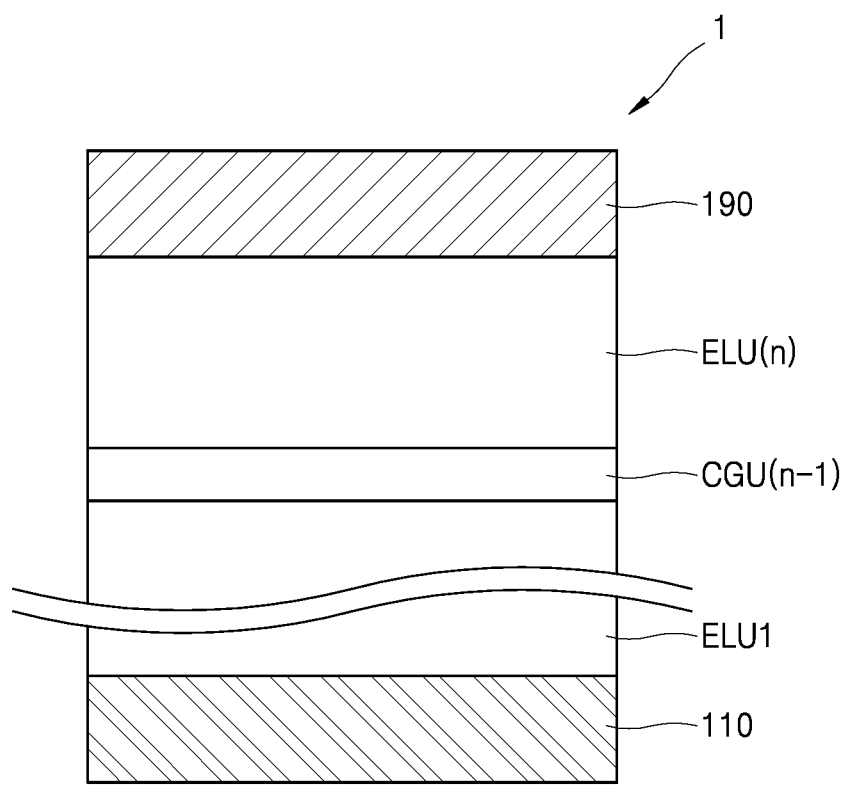
FIG. 1 is a schematic cross-sectional view of a light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

Hereinafter, embodiments of the present disclosure will be described in more detail with reference to the accompanying drawings. The same or corresponding components will be denoted by the same reference numerals, and thus redundant descriptions thereof will not be provided.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments of the present disclosure are not limited thereto.

It will be understood that when a layer, region, or component is referred to as being "connected to" another layer, region, or component, the layer, region, or component may be directly connected to the other layer, region, or component, or indirectly connected to the other layer, region, or component as intervening layer, region, or component may be present therebetween. For example, it will be understood that when a layer, region, or component is referred to as being "electrically connected to" another layer, region, or component, the layer, region, or component may be directly electrically connected to the other layer, region, or component, or indirectly electrically connected to the other layer, region, or component as intervening layer, region, or component may be present therebetween.

The term "interlayer" as used herein refers to all layers (whether a single layer or a plurality of layers) between a first electrode and a second electrode of a light-emitting device. A material included in "an interlayer" may be an organic material and/or an inorganic material.

The expression "(an interlayer) includes at least one compound represented by Formula 1" as used herein may include a case in which "(an interlayer) includes one or more identical compounds represented by Formula 1" and a case in which "(an interlayer layer) includes two or more different compounds represented by Formula 1".

The term "group" as used herein refers to a group of the IUPAC periodic table of the elements.

The term "alkali metal" as used herein refers to group 1 elements. In some embodiments, alkali metal may be lithium (Li), sodium (Na), potassium (K), rubidium (Rb), and/or cesium (Cs).

The term "alkaline earth metal" as used herein refers to group 2 elements. In some embodiments, the alkaline earth metal may be magnesium (Mg), calcium (Ca), strontium (Sr), and/or barium (Ba).

The term "lanthanum metal" as used herein refers to lanthanum and lanthanoid elements in the periodic table. In some embodiments, lanthanoid metal may be lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and/or ruthenium (Lu).

The term "transition metal" as used herein refers to elements that belong to periods 4 to 7 and groups 3 to 12. In some embodiments, a transition metal may be titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), and/or cadmium (Cd).

The term "late transition metal" as used herein refers to metal elements that belong to one of period 4 to period 7 and simultaneously (at the same time) belong to one of group 13 to group 17. In some embodiments, the late transition metal may be aluminum (Al), gallium (Ga), indium (In), thallium (Tl), tin (Sn), lead (Pb), bismuth (Bi), and/or polonium (Po).

The term "halogen" as used herein refers to group 17 elements. In some embodiments, the halogen may be fluorine (F), chlorine (Cl), bromine (Br), and/or iodine (I).

The term "inorganic semiconductor compound" as used herein may refer to all compounds being an inorganic material and having a band gap of less than 4 eV. In some embodiments, the inorganic semiconductor compound may include a halide of lanthanoid metal, a halide of transition metal, a halide of late transition metal, tellurium, a telluride of lanthanoid metal, a telluride of transition metal, a telluride of late transition metal, a selenide of lanthanoid metal, a selenide of transition metal, a selenide of late transition metal, or any combination thereof. For example, the inorganic semiconductor compound may include $EuI_2$, $YbI_2$, $SmI_2$, $TmI_2$, $AgI$, $CuI$, $NiI_2$, $CoI_2$, $BiI_3$, $PbI_2$, $SnI_2$, $Te$, $EuTe$, $YbTe$, $SmTe$, $TmTe$, $EuSe$, $YbSe$, $SmSe$, $TmSe$, $ZnTe$, $CoTe$, $ZnSe$, $CoSe$, $Bi_2Te_3$, $Bi_2Se_3$, or any combination thereof.

The term "inorganic insulation compound" as used herein may refer to all compounds being an inorganic material and having a band gap of at least 4 eV. In some embodiments, the inorganic insulation compound may include a halide of alkali metal, a halide of alkaline earth metal, a halide of lanthanoid metal, or any combination thereof. For example, the inorganic insulation compound may include $NaI$, $KI$, $RbI$, $CsI$, $NaCl$, $KCl$, $RbCl$, $CsCl$, $NaF$, $KF$, $RbF$, $CsF$, $MgI_2$, $CaI_2$, $SrI_2$, $BaI_2$, $MgCl_2$, $CaCl_2$, $SrCl_2$, $BaCl_2$, $MgF_2$, $CaF_2$, $SrF_2$, $BaF_2$, $EuI_3$, $YbI_3$, $SmI_3$, $TmI_3$, $EuCl_3$, $YbCl_3$, $SmCl_3$, $TmCl_3$, $EuF_3$, $YbF_3$, $SmF_3$, $TmF_3$, or any combination thereof.

The term "halide of an alkali metal" as used herein refers to a compound in which an alkali metal and a halogen are ionically bonded. In some embodiments, the halide of an alkali metal may include $NaI$, $KI$, $RbI$, $CsI$, $NaCl$, $KCl$, $RbCl$, $CsCl$, $NaF$, $KF$, $RbF$, $CsF$, or any combination thereof.

The term "halide of an alkaline earth metal" as used herein refers to a compound in which an alkaline earth metal and a halogen are ionically bonded. In some embodiments, a halide of an alkaline earth metal may include $MgI_2$, $CaI_2$, $SrI_2$, $BaI_2$, $MgCl_2$, $CaCl_2$, $SrCl_2$, $BaCl_2$, $MgF_2$, $CaF_2$, $SrF_2$, $BaF_2$, or any combination thereof.

The term "halide of a lanthanoid metal" as used herein refers to a compound in which a lanthanoid metal and a halogen are ionically bonded and/or covalently bonded. In some embodiments, the halide of lanthanoid metal may include $EuI_2$, $YbI_2$, $SmI_2$, $TmI_2$, $EuI_3$, $YbI_3$, $SmI_3$, $TmI_3$, $EuCl_3$, $YbCl_3$, $SmCl_3$, $TmCl_3$, $EuF_3$, $YbF_3$, $SmF_3$, $TmF_3$, or any combination thereof.

The term "halide of a transition metal" as used herein refers to a compound in which a transition metal and a halogen are ionically bonded and/or covalently bonded. In some embodiments, a halide of a transition metal may include $AgI$, $CuI$, $NiI_2$, $CoI_2$, or any combination thereof.

The term "halide of a late transition metal" as used herein refers to a compound in which a late transition metal and a halogen are ionically bonded and/or covalently bonded. In some embodiments, a halide of a late transition metal may include $BiI_3$, $PbI_2$, $SnI_2$, or any combination thereof.

The term "telluride of a lanthanoid metal" as used herein refers to a compound in which a lanthanoid metal and tellurium (Te) are ionically bonded, covalently bonded, and/or metallically bonded. In some embodiments, a telluride of a lanthanoid metal may include $EuTe$, $YbTe$, $SmTe$, $TmTe$, or any combination thereof.

The term "telluride of a transition metal" as used herein refers to a compound in which a transition metal and tellurium are ionically bonded, covalently bonded, and/or metallically bonded. In some embodiments, a telluride of a transition metal may include $ZnTe$, $CoTe$, or any combination thereof.

The term "telluride of a late transition metal" as used herein refers to a compound in which a late transition metal and tellurium are ionically bonded, covalently bonded, and/or metallically bonded. In some embodiments, a telluride of a late transition metal may include $Bi_2Te_3$.

The term "selenide of a lanthanoid metal" as used herein refers to a compound in which a lanthanoid metal and selenium (Se) are ionically bonded, covalently bonded, and/or metallically bonded. In some embodiments, a selenide of a lanthanoid metal may include $EuSe$, $YbSe$, $SmSe$, $TmSe$, or any combination thereof.

The term "selenide of a transition metal" as used herein refers to a compound in which a transition metal and selenium are ionically bonded, covalently bonded, and/or metallically bonded. In some embodiments, a selenide of a transition metal may include ZnSe, CoSe, or any combination thereof.

The term "selenide of a late transition metal" as used herein refers to a compound in which a late transition metal and selenium are ionically bonded, covalently bonded, and/or metallically bonded. In some embodiments, a selenide of a late transition metal may include $Bi_2Se_3$.

Description of FIG. 1

FIG. 1 is a schematic cross-sectional view of a light-emitting device according to an embodiment.

Referring to FIG. 1, a light-emitting device (1) according to an embodiment may include a first electrode 110, a second electrode 190 facing the first electrode 110, light-emitting units (ELU) in the number of n between the first electrode 110 and the second electrode 190, and a charge-generation unit(s) (CGU) in the number of n−1 between the adjacent light-emitting units, wherein n may be a natural number of 2 or more, the light-emitting units may each independently include an emission layer, and at least one of the charge-generation unit(s) may include an n-type charge-generation layer, a p-type charge-generation layer, and an interlayer between the n-type charge-generation layer and the p-type charge-generation layer.

Hereinafter, the structure of the light-emitting device 1 according to an embodiment and a method of manufacturing the light-emitting device 1 will be described in connection with FIG. 1.

First Electrode

In FIG. 1, a substrate may be additionally positioned under the first electrode 110 or above the second electrode 190. The substrate may be a glass substrate and/or a plastic substrate, each having excellent mechanical strength, thermal stability, transparency, surface smoothness, ease of handling, and/or water resistance.

The first electrode 110 may be formed by depositing or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-reflective electrode, or a transmissive electrode. When the first electrode 110 is a transmissive electrode, a material for forming the first electrode 110 may be selected from indium tin oxide (ITO), indium zinc oxide (IZO), tin oxide ($SnO_2$), zinc oxide (ZnO), and any combinations thereof, but embodiments of the present disclosure are not limited thereto. In one or more embodiments, when the first electrode 110 is a semi-transmissive electrode or a reflective electrode, a material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Light-Emitting Unit

Light-emitting units in the number of n are positioned above the first electrode 110.

Among the light-emitting units in the number of n, a light-emitting unit which is the closest to the first electrode may be a first light-emitting unit, a light-emitting unit which is the farthest from the first electrode may be an $n^{th}$ light-emitting unit, and the first light-emitting unit to the $n^{th}$ light-emitting unit are sequentially placed. That is, an $n-1^{th}$ light-emitting unit is between the first electrode and the $n^{th}$ light-emitting unit.

The light-emitting units may each independently further include an electron transport region and/or a hole transport region.

The plurality of hole transport regions may each independently include a first buffer layer, a hole injection layer, a hole transport layer, an electron blocking layer, or any combination thereof; the plurality of electron transport regions may each independently include a first buffer layer, a hole blocking layer, an electron transport layer, an electron injection layer, or any combination thereof.

In one embodiment, the first electrode may be an anode, the second electrode may be a cathode, and an $n^{th}$ light-emitting unit may be between the first electrode and the second electrode; an $n-1^{th}$ light-emitting unit may be between the first electrode and the $n^{th}$ light-emitting unit; an $n-1^{th}$ charge-generation unit may be between the $n^{th}$ light-emitting unit and the $n-1^{th}$ light-emitting unit, the $n^{th}$ light-emitting unit including an $n^{th}$ emission layer and the $n-1^{th}$ light-emitting unit including an $n-1^{th}$ emission layer; an $n-1^{th}$ hole transport region may be between the first electrode and the $n-1^{th}$ emission layer; an $n-1^{th}$ electron transport region may be between the $n-1^{th}$ emission layer and the $n-1^{th}$ charge-generation unit; an $n^{th}$ hole transport region may be between the $n-1^{th}$ charge-generation unit and the $n^{th}$ emission layer; and an $n^{th}$ electron transport region may be between the $n^{th}$ emission layer and the second electrode. The plurality of hole transport regions may each independently include a first buffer layer, a hole injection layer, a hole transport layer, an electron blocking layer, or any combination thereof, and the plurality of electron transport regions may each independently include a hole blocking layer, an electron transport layer, an electron injection layer, a second buffer layer, or any combination thereof.

Hole Injection Layer in Hole Transport Region

The light-emitting device may include a hole injection layer between the first electrode and the first emission layer and/or between the $n-1^{th}$ charge-generation unit and the $n^{th}$ emission layer.

The hole injection layer may include a sixth material and a seventh material, and the sixth material and the seventh material may be different from each other.

For example, the sixth material may include a halide of lanthanoid metal, a halide of transition metal, a halide of late transition metal, tellurium, a telluride of lanthanoid metal, a telluride of transition metal, a telluride of late transition metal, a selenide of lanthanoid metal, a selenide of transition metal, a selenide of late transition metal, or any combination thereof.

In some embodiments, in the hole injection layer, a volume of the seventh material may be equal to or greater than a volume of the sixth material.

For example, the volume of the sixth material may be about 50% or less in the hole injection layer.

For example, the seventh material may include a hole-transporting organic compound, a halide of alkali metal, a halide of alkaline earth metal, a halide of lanthanoid metal, or any combination thereof.

The seventh material may include at least one selected from the hole-transporting organic compound, and a volume ratio of the sixth material to the seventh material may be in a range of about 1:99 to about 20:80.

In some embodiments, the seventh material may include a halide of alkali metal, a halide of alkaline earth metal, a halide of lanthanoid metal, or any combination thereof, and a volume ratio of the sixth material to the seventh material may be in a range of about 1:99 to about 50:50.

The term "hole-transporting organic compound" as used herein refers to all suitable organic materials having hole-transporting properties.

In some embodiments, the hole-transporting organic compound may be selected from m-MTDATA, TDATA, 2-TNATA, NPB (NPD), β-NPB, TPD, spiro-TPD, spiro-NPB, methylated NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, and a compound represented by Formula 202 below:

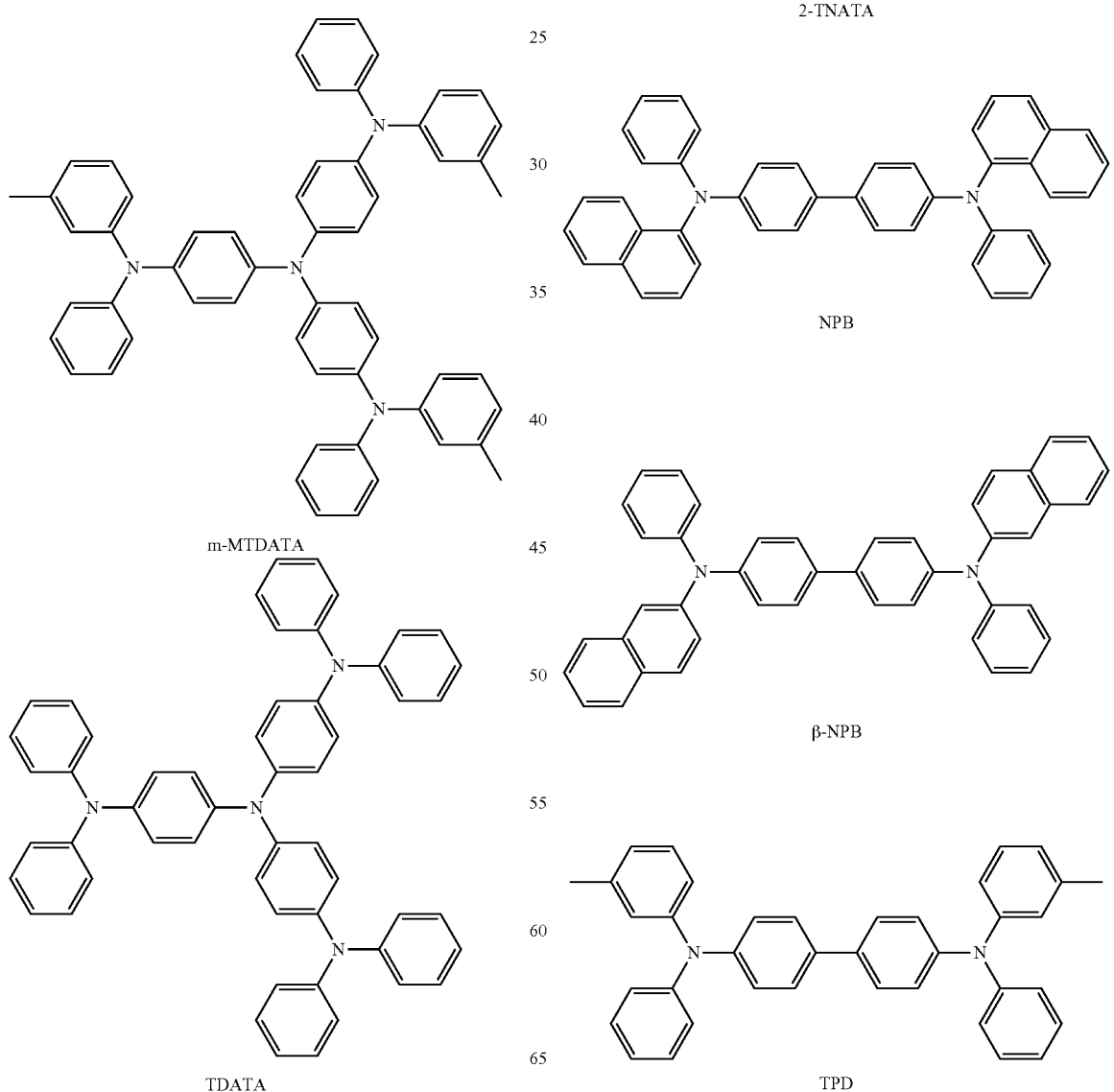

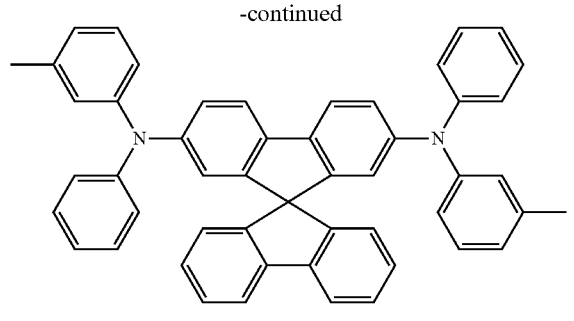

Spiro-TPD

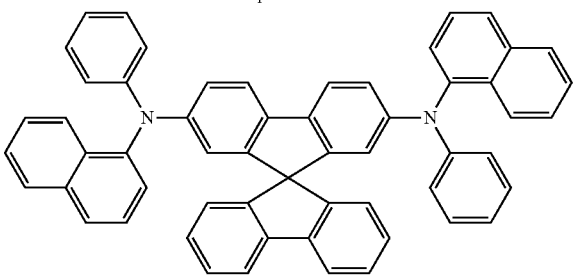

Spiro-NPB

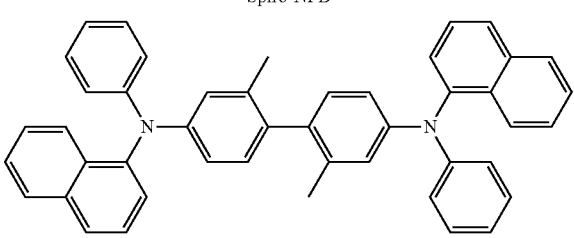

methylated NPB

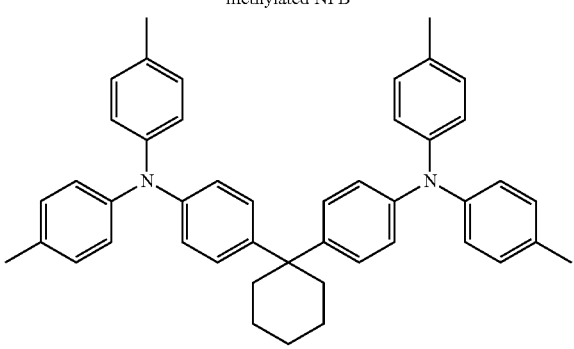

TAPC

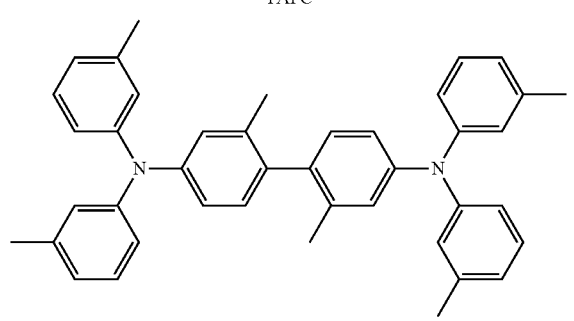

HMTPD

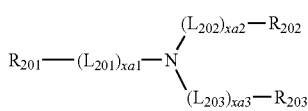

Formula 201

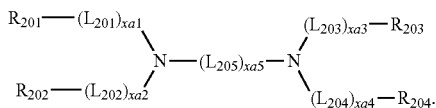

Formula 202

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, and/or a diphenyl-methylene group; and $R_{203}$ and $R_{204}$ may optionally be linked to each other via a single bond, a dimethyl-methylene group, and/or a diphenyl-methylene group.

In one embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ are the same as described above.

In one or more embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked to each other via a single bond, and/or ii) $R_{203}$ and $R_{204}$ may be linked to each other via a single bond.

In one or more embodiments, $R_{201}$ to $R_{204}$ in Formula 202 may each independently be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201A below:

Formula 201A

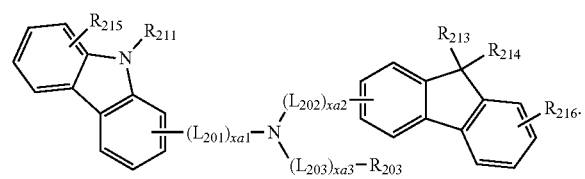

In one embodiment, the compound represented by Formula 201 may be represented by Formula 201A(1) below, but embodiments of the present disclosure are not limited thereto:

Formula 201A(1)

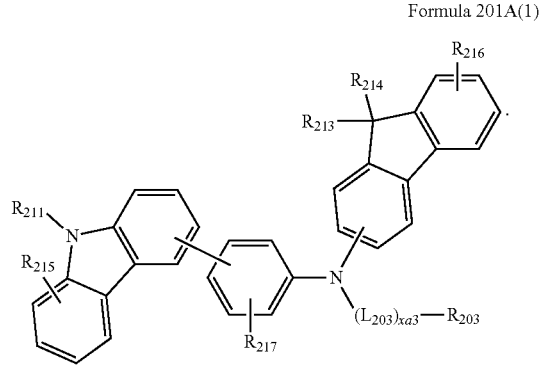

In one or more embodiments, the compound represented by Formula 201 may be represented by Formula 201A-1 below, but embodiments of the present disclosure are not limited thereto:

Formula 201A-1

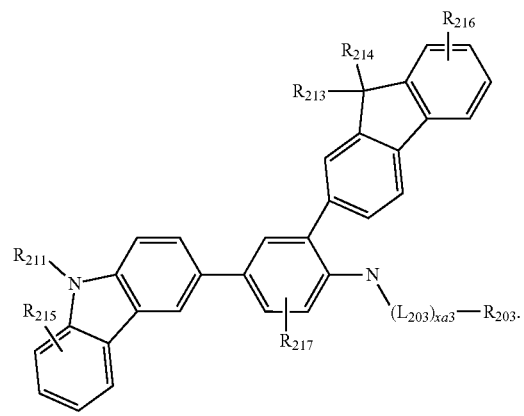

In one embodiment, the compound represented by Formula 202 may be represented by Formula 202A below:

Formula 202A

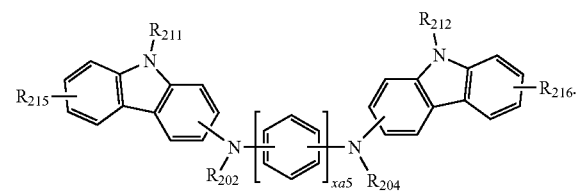

In one or more embodiments, the compound represented by Formula 202 may be represented by Formula 202A-1 below:

Formula 202A-1

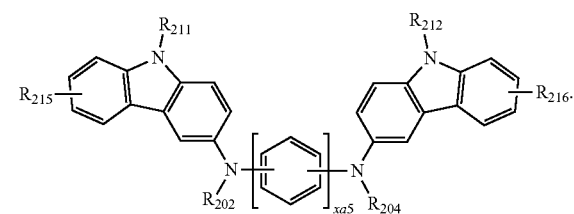

In Formulae 201A, 201A(1), 201A-1, 202A, and 202A-1, $L_{201}$ to $L_{203}$, xa1 to xa3, xa5, and $R_{202}$ to $R_{204}$ may each be understood by referring to the corresponding descriptions thereof provided above, $R_{211}$ and $R_{212}$ may each be understood by referring to description provided in connection with $R_{203}$, $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments of the present disclosure are not limited thereto:

HT1
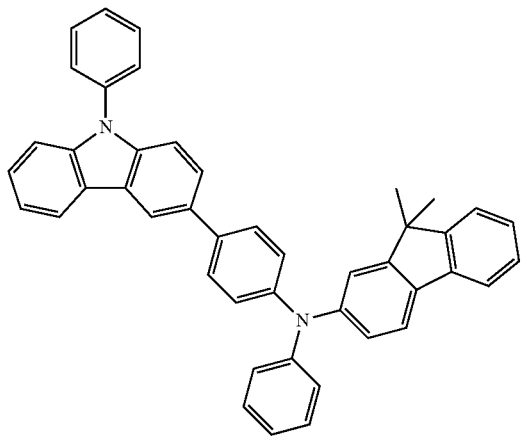

HT2
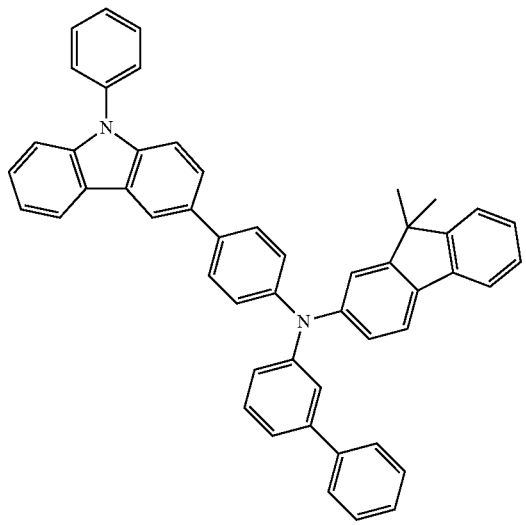

HT3
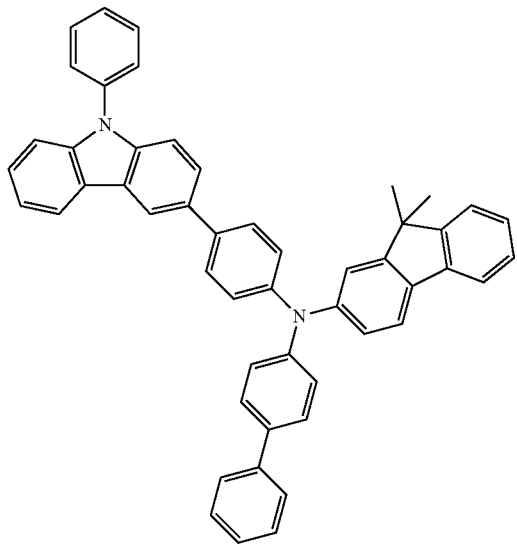

HT4
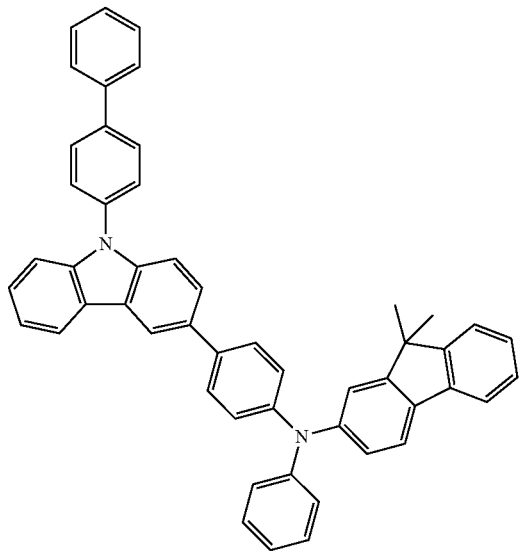

HT5
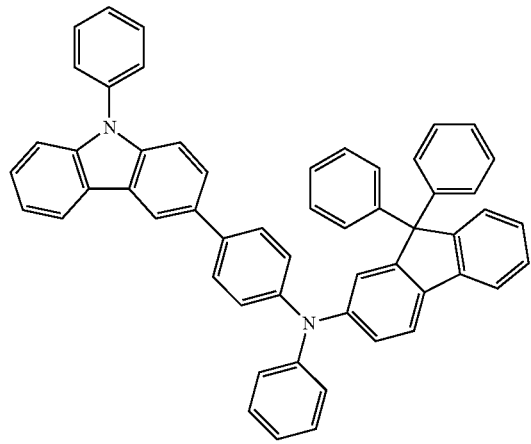
HT6
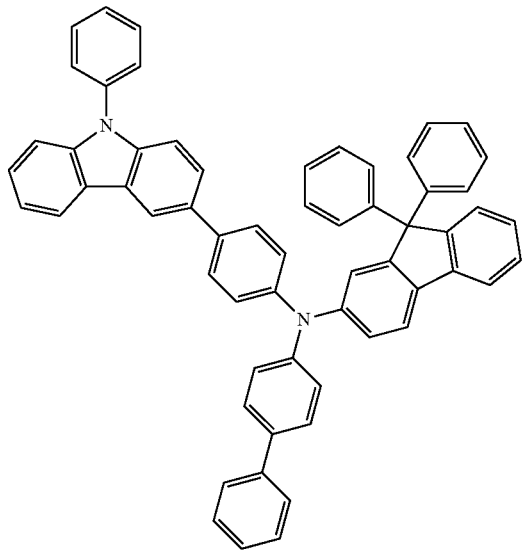
HT7
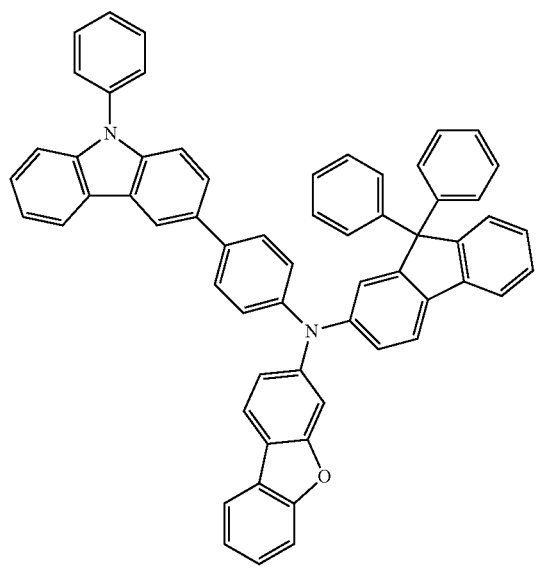
HT8
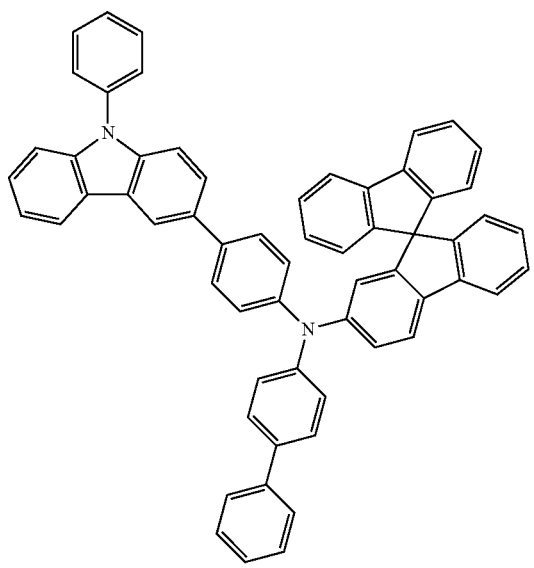

-continued
HT9
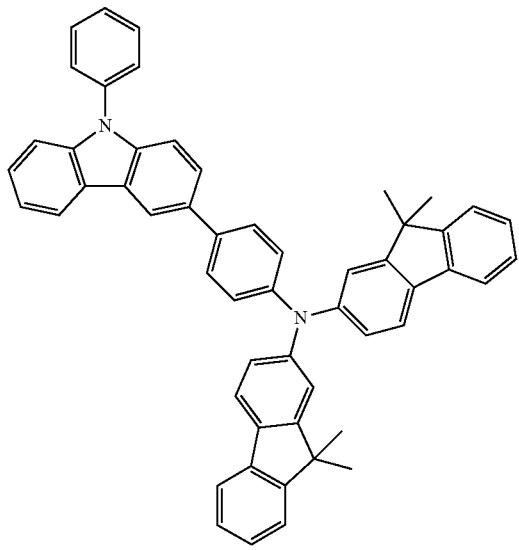
HT10
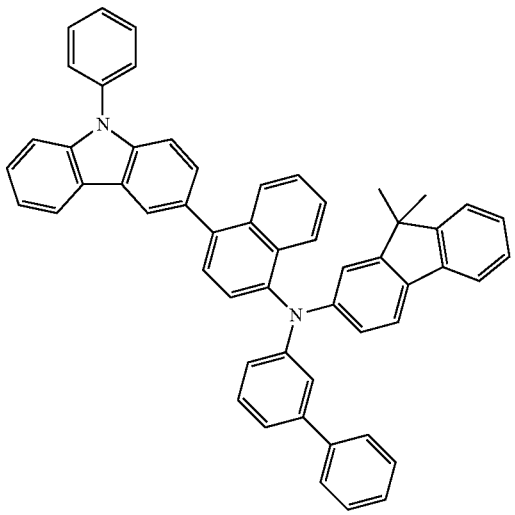
HT11
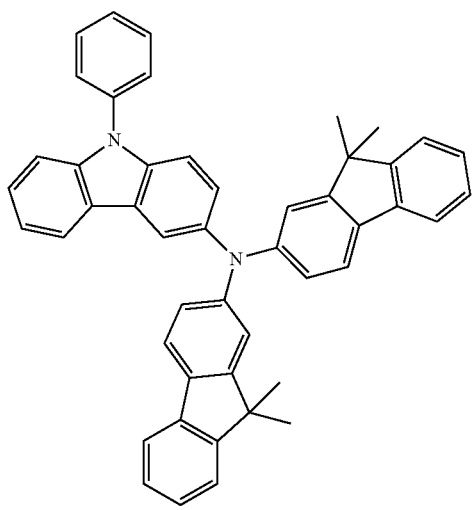
HT12
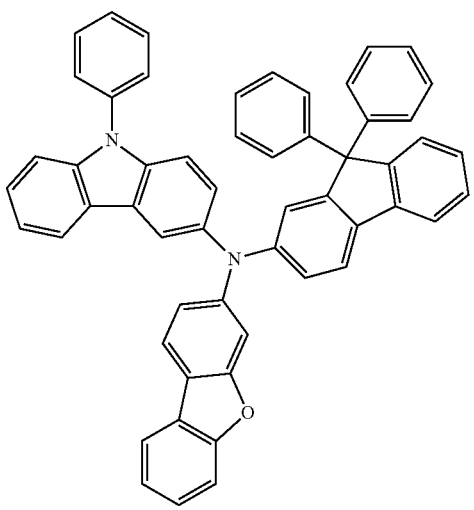
HT13
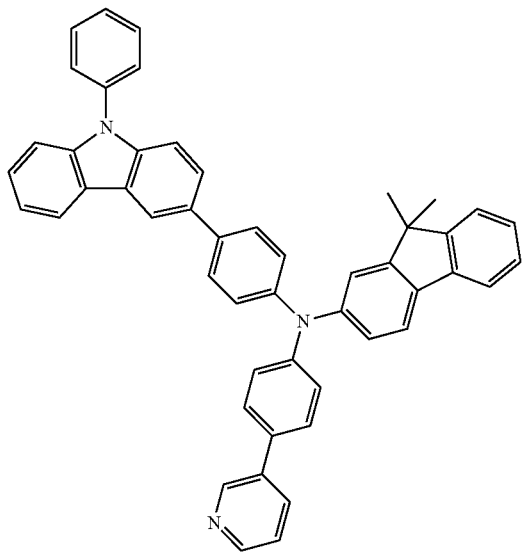
HT14
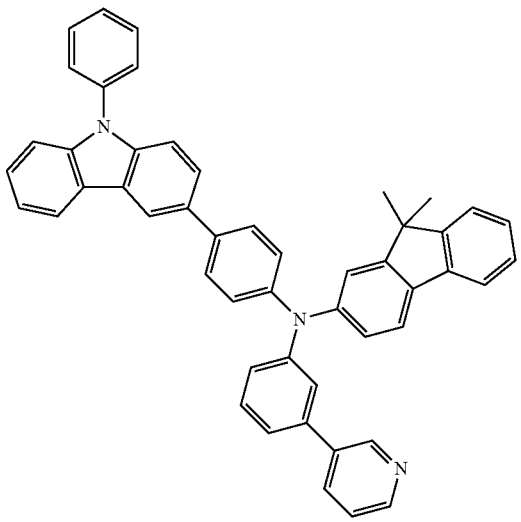

-continued
HT15
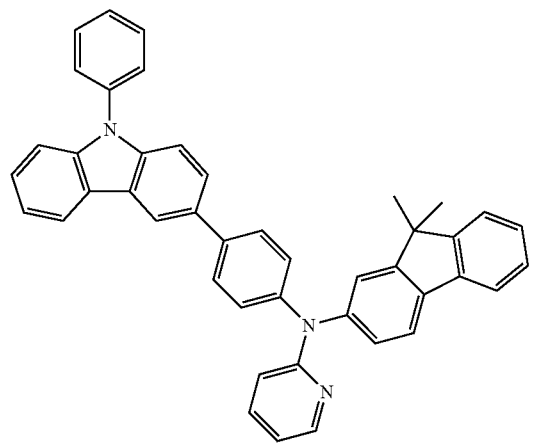
HT16
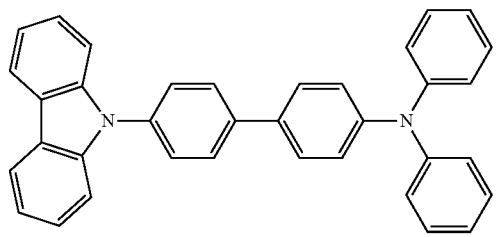
HT17
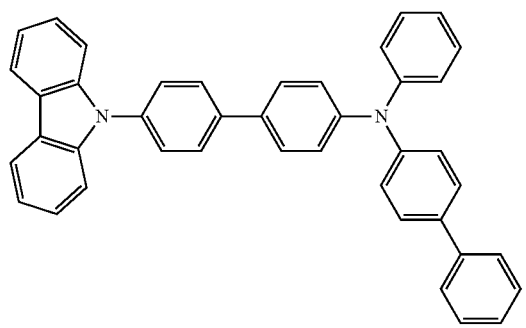
HT18
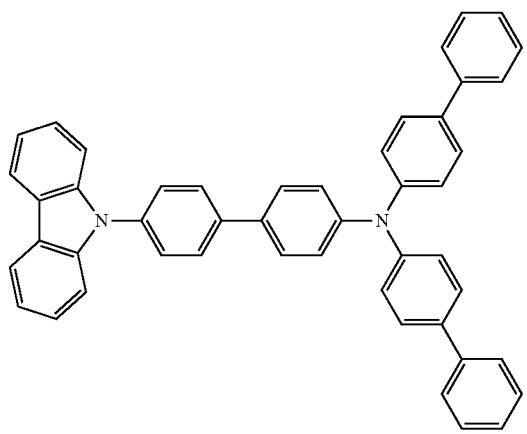
HT19
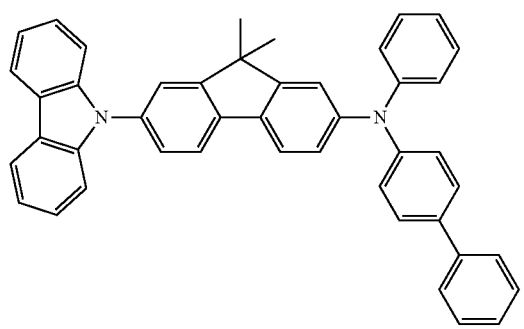
HT20
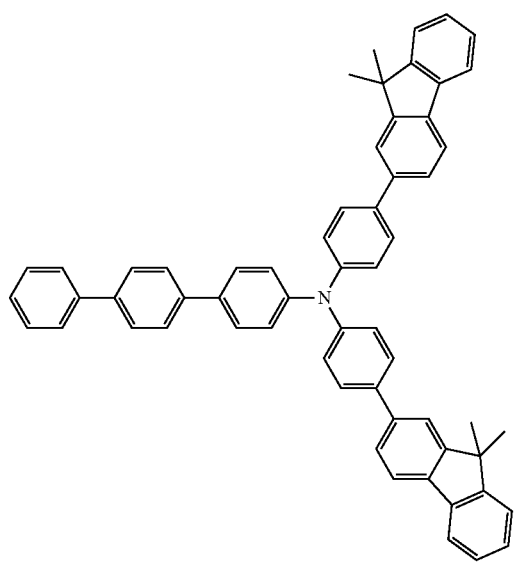

-continued
HT21
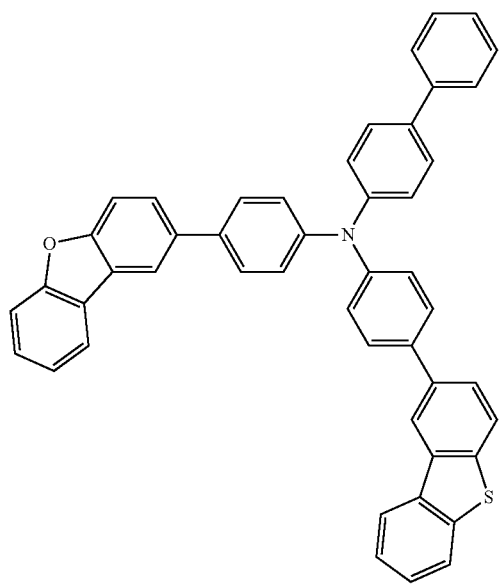
HT22
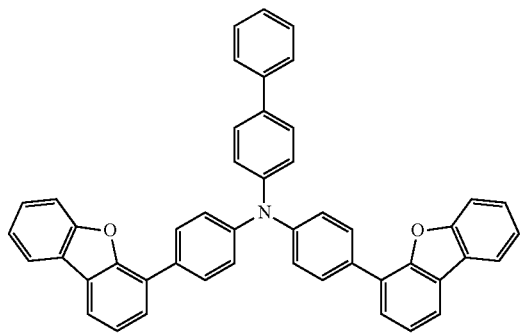
HT23
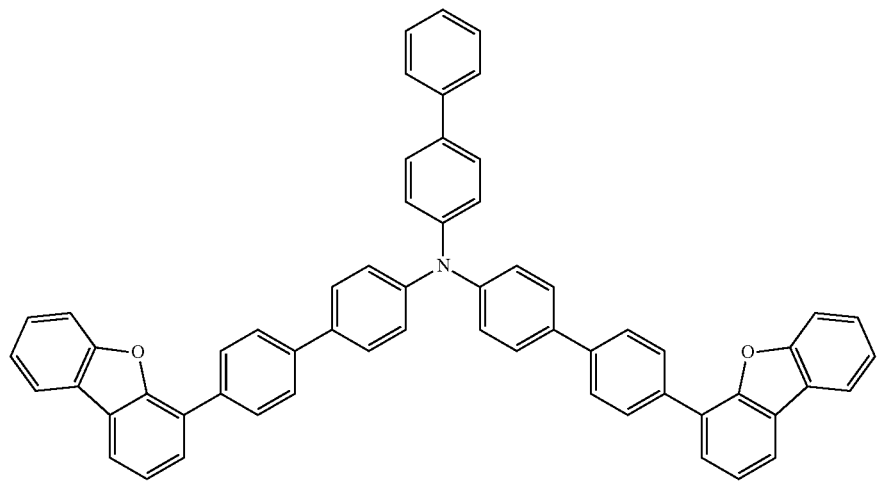
HT24
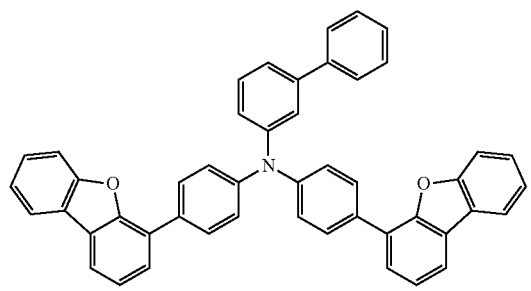
HT25
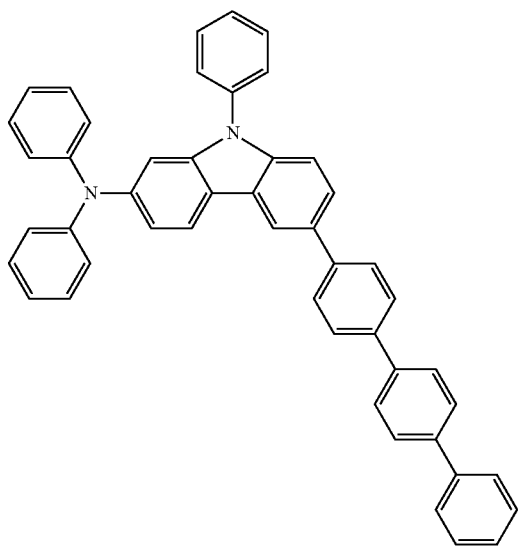

-continued
HT26
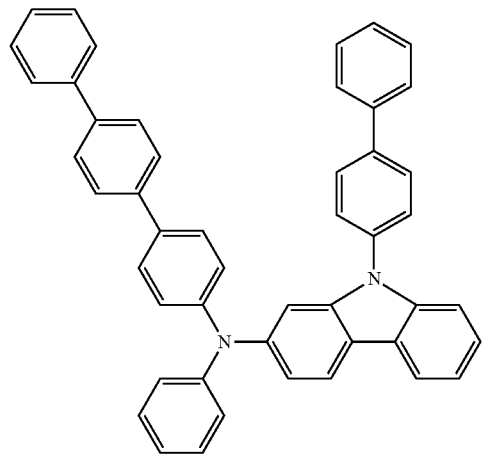
HT27
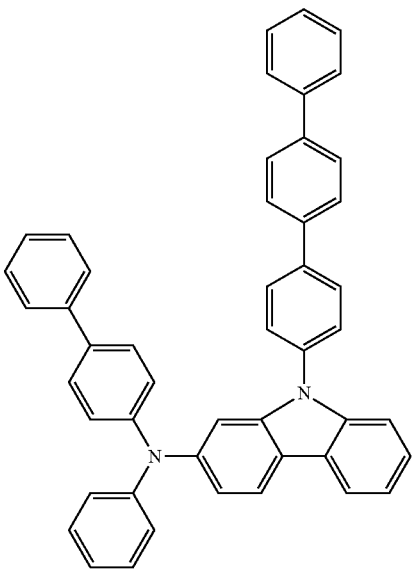
HT28
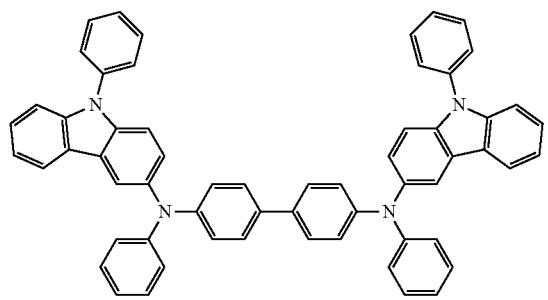
HT29
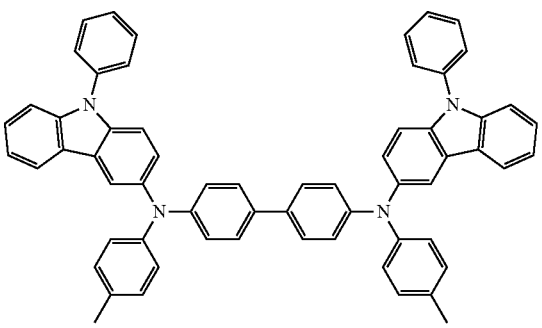
HT30
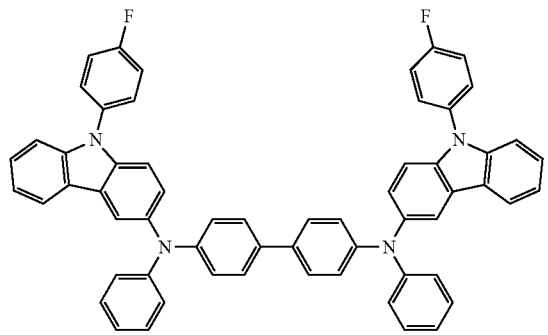
HT31
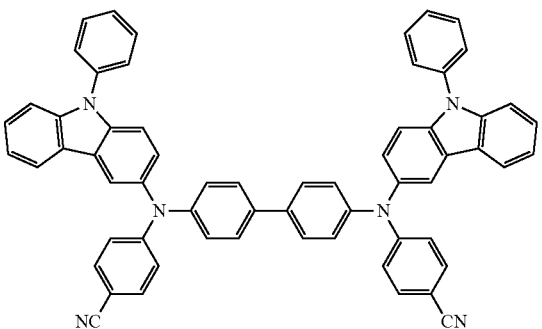

-continued
HT32
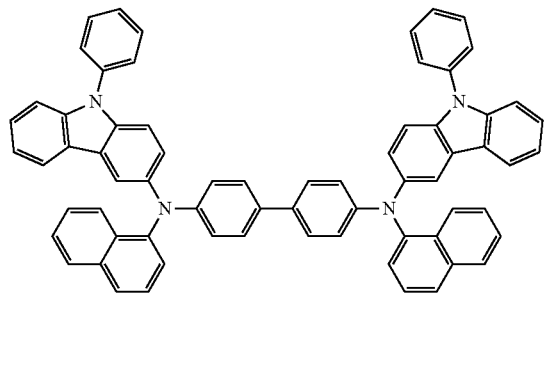
HT33
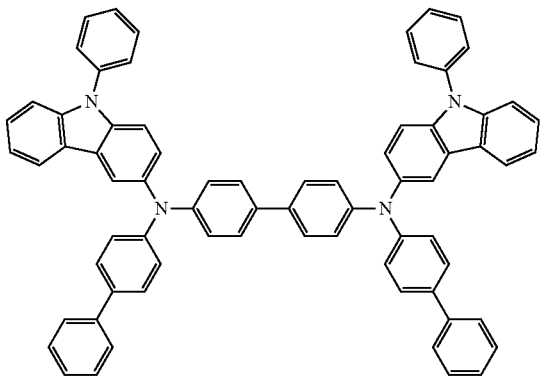
HT34
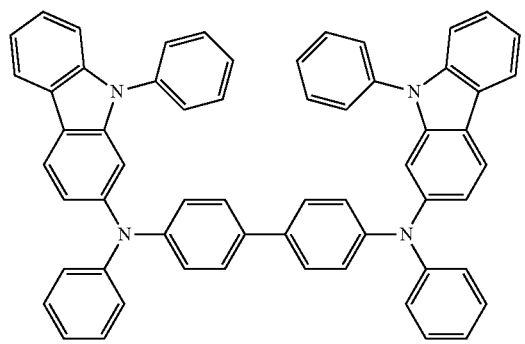
HT35
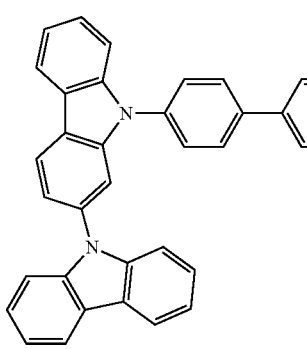
HT36
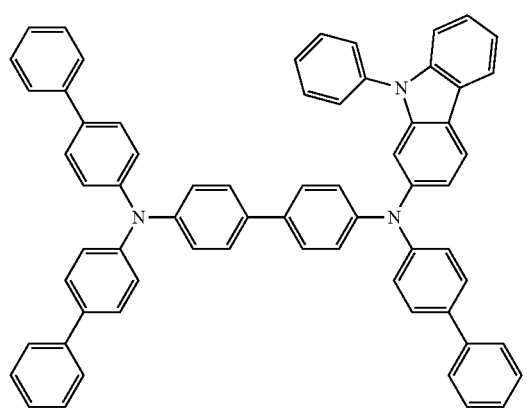
HT37
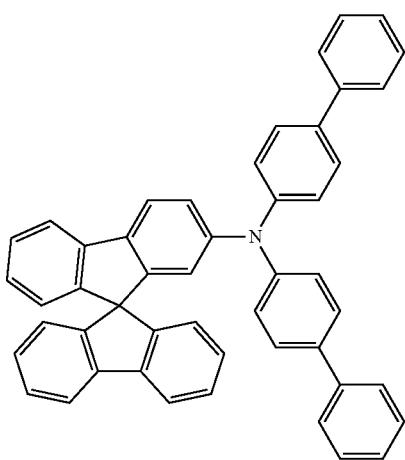

HT38

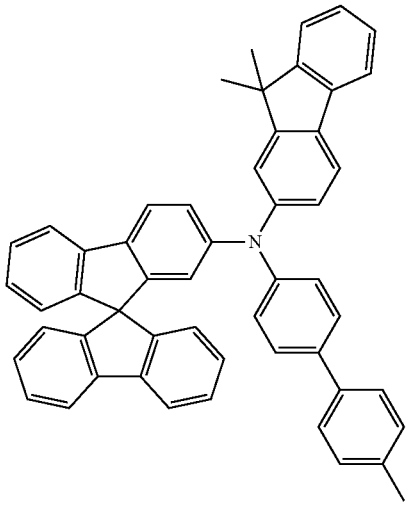

HT39

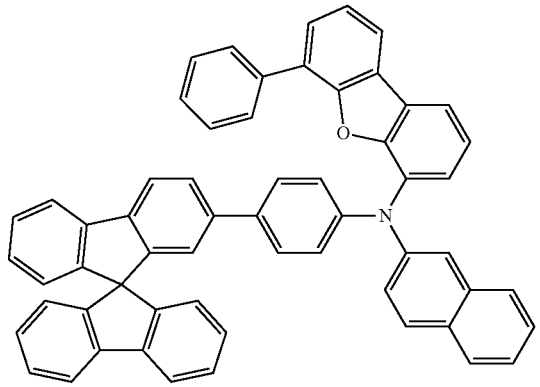

A thickness of the hole injection layer may be in a range of about 0.1 to about 20 nm. When the thickness of the hole injection layer is within the range above, suitable hole injection characteristics may be obtained without a substantial increase in driving voltage.

Hole Transport Layer in Hole Transport Region

The light-emitting device may include a hole transport layer that is in direct contact with the emission layer.

The hole transport layer may include a tenth material and an eleventh material, wherein the tenth material and the eleventh material may be different from each other. The tenth material may include at least one selected from a hole-transporting organic compound, and the eleventh material may include a halide of alkaline earth metal, a halide of lanthanoid metal, or any combination thereof.

In the hole transport layer, a volume of the tenth material may be equal to or greater than a volume of the eleventh material. In some embodiments, a volume ratio of the tenth material to the eleventh material in the hole transport layer may be in a range of about 99:1 to about 50:50.

A thickness of the hole transport layer may be in a range of about 0.1 to about 10 nm. When the thickness of the hole transport layer is within the range above, suitable hole transport characteristics may be obtained without a substantial increase in driving voltage.

Charge-Generation Material in Hole Transport Region

The hole transport region may further include, in addition to the materials described above, a charge-generation material for the improvement of conductive properties. The charge-generation material may be homogeneously or non-homogeneously dispersed in the hole transport region.

The charge-generation material may be, for example, a p-dopant.

In one embodiment, the p-dopant may have a lowest unoccupied molecular orbital (LUMO) energy level of −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from: a quinone derivative, such as tetracyanoquinodimethane (TCNQ) and/or 2,3,5,6-tetrafluoro-7,7,8,8-tetracyanoquinodimethane (F4-TCNQ);

a metal oxide, such as tungsten oxide and/or molybdenum oxide;

1,4,5,8,9,11-hexaazatriphenylene-hexacarbonitrile (HAT-CN); and a compound represented by Formula 221 below, but embodiments of the present disclosure are not limited thereto:

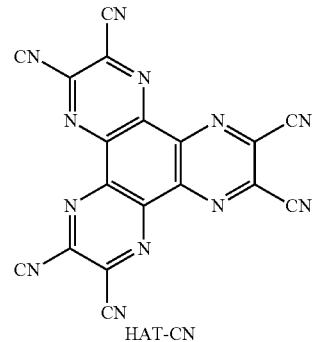

HAT-CN

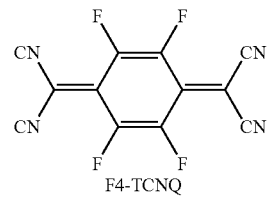

F4-TCNQ

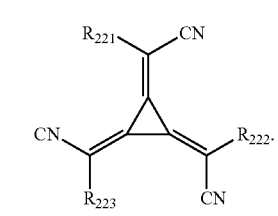

Formula 221

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer

The light-emitting units may each independently include an emission layer. For example, one light-emitting unit may include one emission layer.

A plurality of the emission layers may each independently emit light of different colors from one another, or may each independently emit light of the same color. For example, each of the plurality of the emission layers may emit blue light, but embodiments are not limited thereto.

The emission layer may include at least one selected from an organic compound and a semiconductor compound, but embodiments are not limited thereto. When the emission layer includes an organic compound, the light-emitting device may be referred to as an organic light-emitting device.

In some embodiments, the organic compound may include a host and a dopant.

In some embodiments, the semiconductor compound may be a quantum dot, that is, the light-emitting device may be a quantum-dot light-emitting device.

In some embodiments, the semiconductor compound may be organic and/or inorganic perovskite.

A thickness of the emission layer may be in a range of about 0.1 nm to about 100 nm. In some embodiments, the thickness of the emission layer may be in a range of about 15 nm to about 50 nm. When the emission layer emits blue light, a thickness of a blue emission layer may be in a range of about 15 nm to about 20 nm; when the emission layer emits green light, a thickness of a green emission layer may be in a range of about 20 nm to about 40 nm; and when the emission layer emits red light, a thickness of a red emission layer may be in a range of about 40 nm to about 50 nm. When the thickness of the emission layer is satisfied within the range above, the light-emitting device may obtain excellent (or suitable) light-emission characteristics without a substantial increase in driving voltage.

The emission layer of the organic light-emitting device may include a host and a dopant. The dopant may include a phosphorescent dopant, a fluorescent dopant, a delayed fluorescence dopant, or any combination thereof.

An amount of the dopant in the emission layer may be in a range of about 0.01 parts by weight to about 15 parts by weight based on 100 parts by weight of the host, but embodiments of the present disclosure are not limited thereto.

The host may include a compound represented by Formula 301 below:

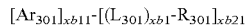  Formula 301

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), xb21 may be an integer from 1 to 5, and $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

When xb11 in Formula 301 is 2 or more, two or more $Ar_{301}$(s) may be linked to each other via a single bond.

In one or more embodiments, the compound represented by Formula 301 may be represented by Formula 301-1 or 301-2 below:

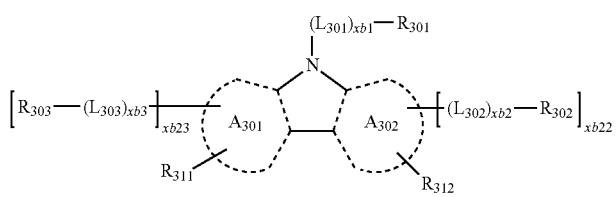

Formula 301-1

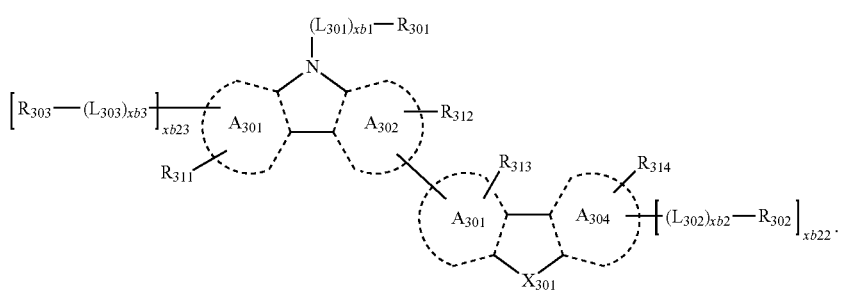

Formula 301-2

In Formulae 301-1 and 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and a dinaphthothiophene group, $X_{301}$ may be O, S, or N-[$(L_{304})_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ may each be understood by referring to the corresponding descriptions thereof provided above, $L_{302}$ to $L_{304}$ may each be understood by referring to description provided in connection with $L_{301}$, xb2 to xb4 may each be understood by referring to description provided in connection with xb1, and $R_{302}$ to $R_{304}$ may each be understood by referring to description provided in connection with $R_{301}$.

For example, $L_{301}$ to $L_{304}$ in Formulae 301, 301-1, and 301-2 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ are the same as described above.

In one embodiment, $R_{301}$ to $R_{304}$ in Formulae 301, 301-1, and 301-2 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazoyly group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyrdinyl group, a quinoxalinyl group, a quibazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydrozyly group, a cyano group, a nitro group, an amindo group, a hydrazino group, a hydrazono group, a $C_1$-$C_{20}$ alkyl group, a $C_1$-$C_{20}$ alkoxy group, a phenyl group, a biphenyl group, a terphenyl group, a terphnyl group, a naphthyl group, a fluorenyl group, a spiro-bifluorenyl group, a benzofluorenyl group, a dibenzofluoenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiozolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzinidazolyl group, an isobenzothiazolyl group, a benzoxazolyl group, an isobenzoxazolyl group, a triazolyl group, a tetrazolyl group, an imidazopyradinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ are the same as described above.

In one or more embodiments, the host may include an alkaline earth metal complex. For example, the host may be selected from a Be complex (for example, Compound H55), a Mg complex, and a Zn complex.

The host may include at least one selected from 9,10-di (2-naphthyl)anthracene (ADN), 2-methyl-9,10-bis(naphthalen-2-yl)anthracene (MADN), 9,10-di-(2-naphthyl)-2-t- butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55 below, but embodiments of the present disclosure are not limited thereto:
H1
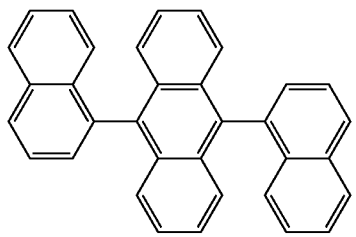
H2
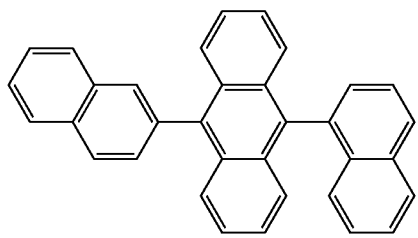
H3
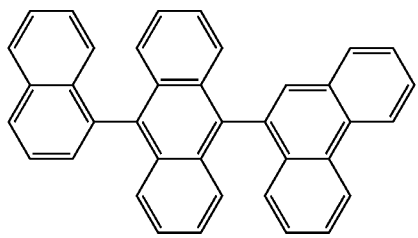
H4
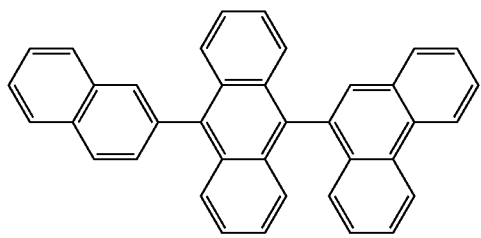
H5
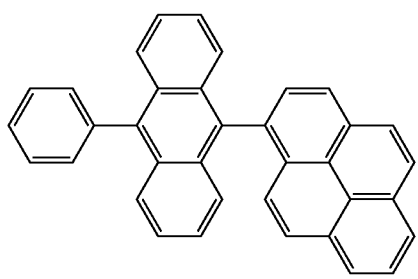
H6
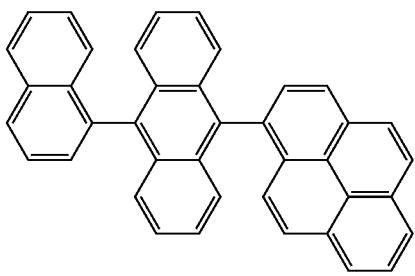
H7
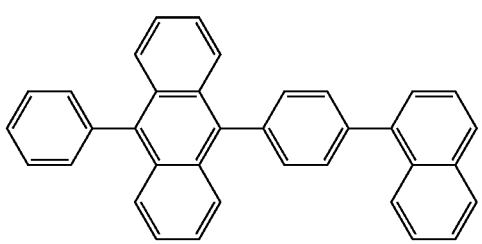
H8
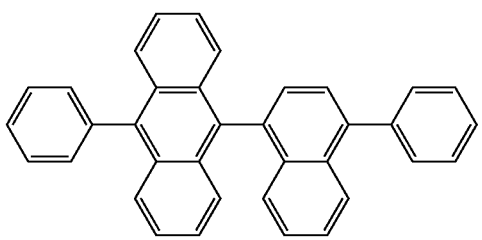
H9
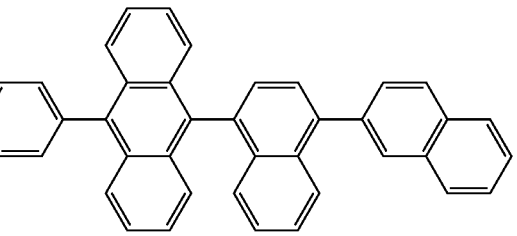
H10
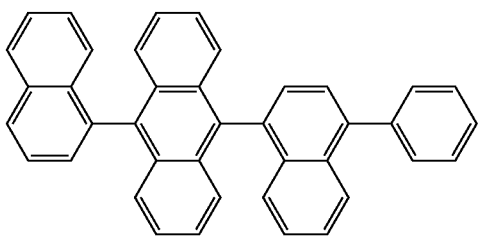
H11
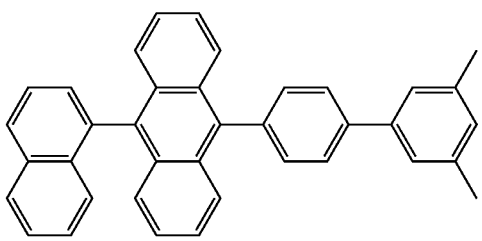

H12
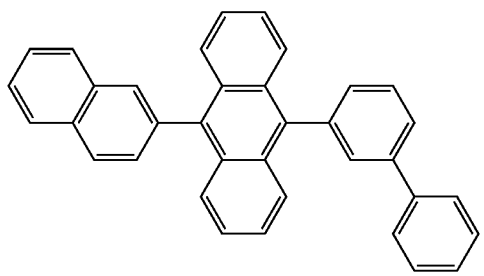
H13
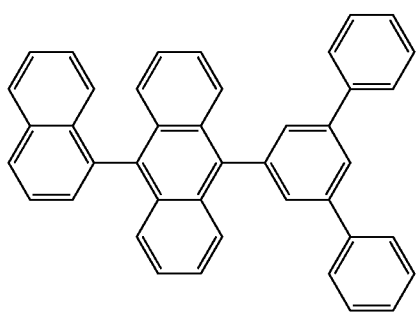
H14
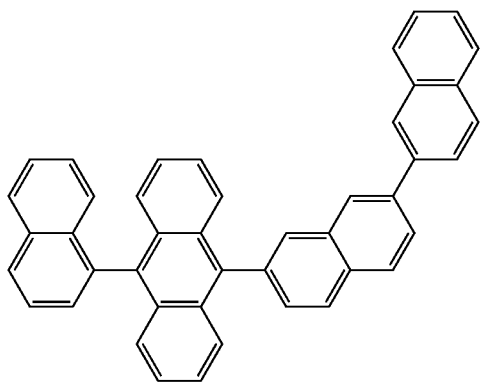
H15
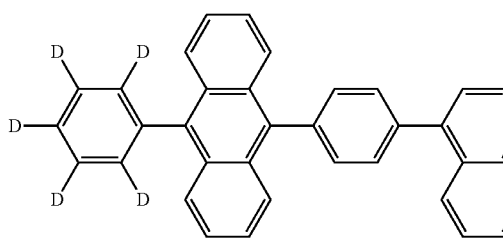
H16
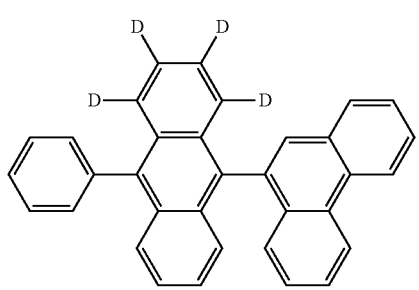
H17
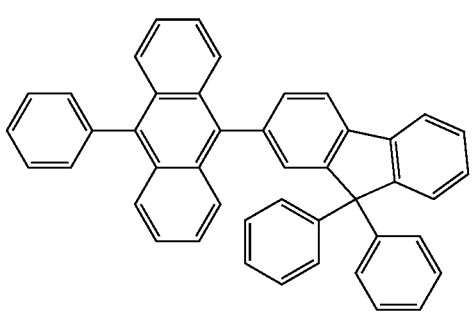
H18
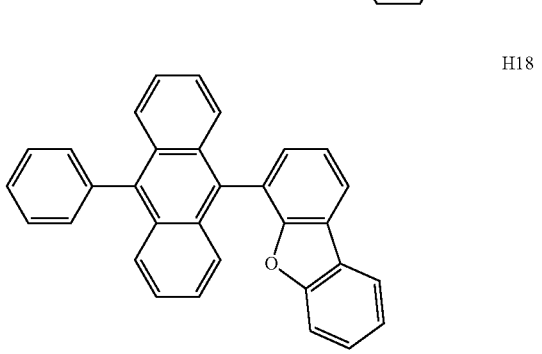
H19
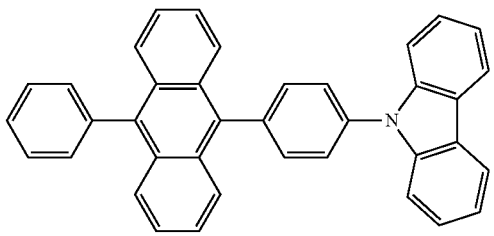
H20
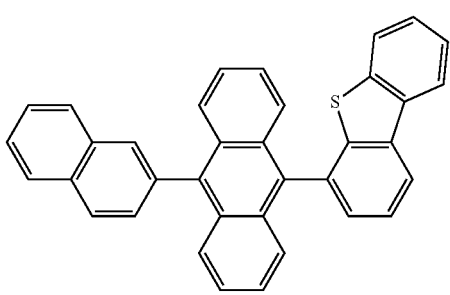
H21
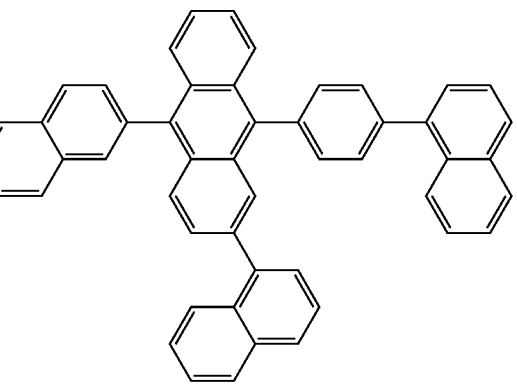

H22
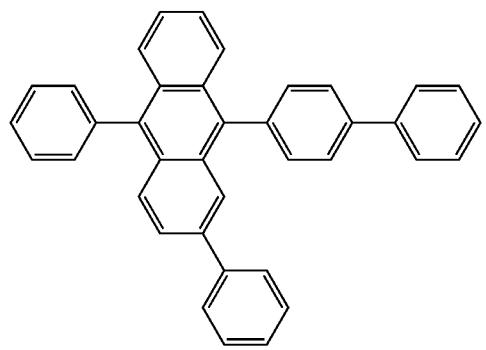
H25
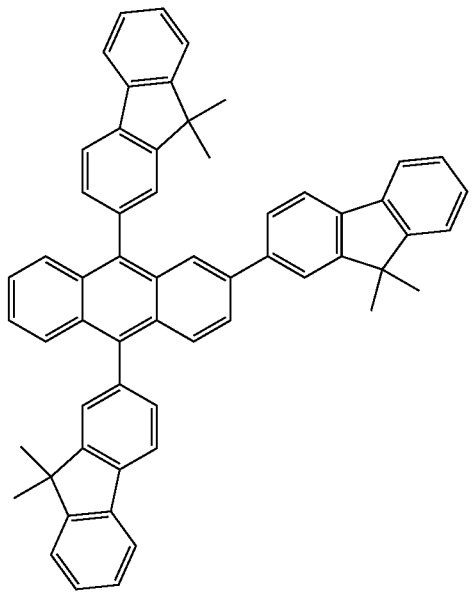
H23
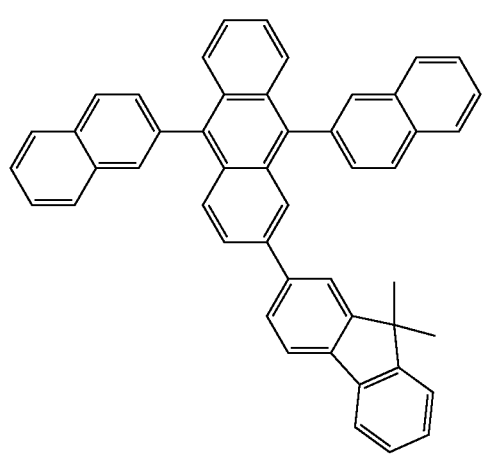
H24
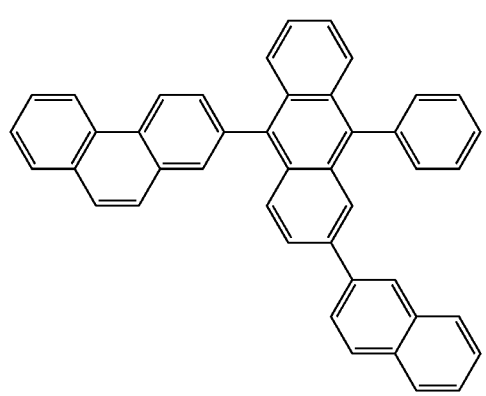
H26
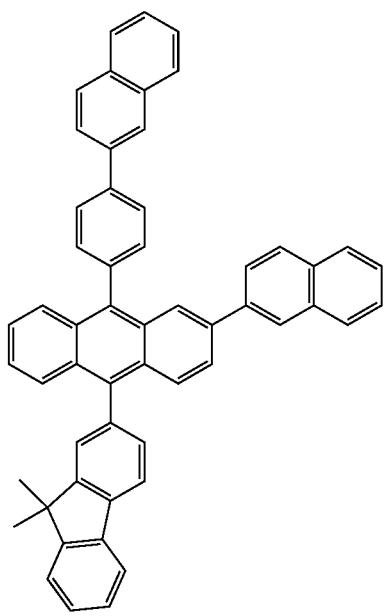

H27
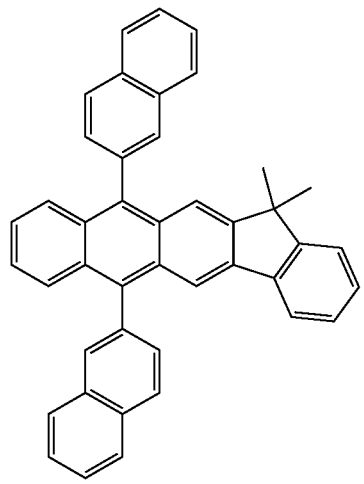
H28
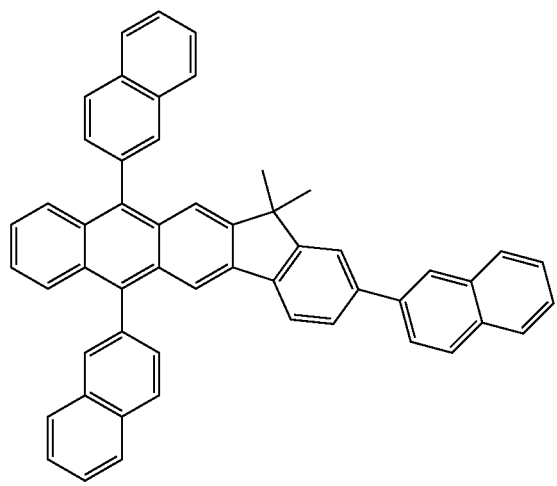
H29
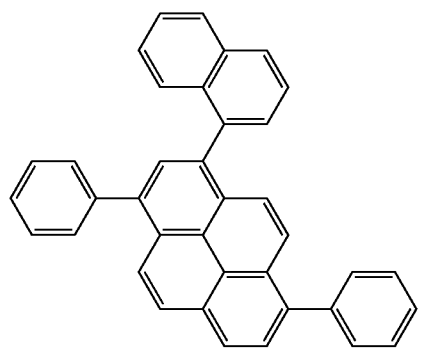
H30
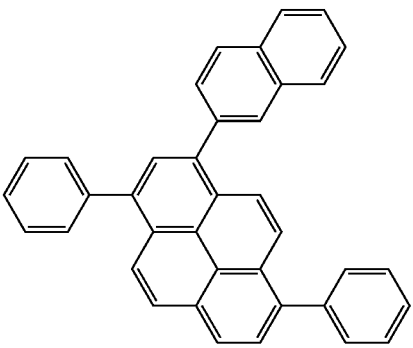
H31
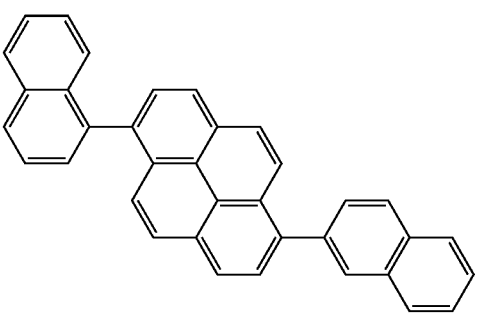
H32
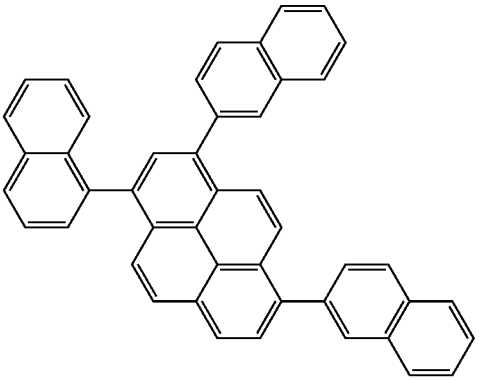
H33
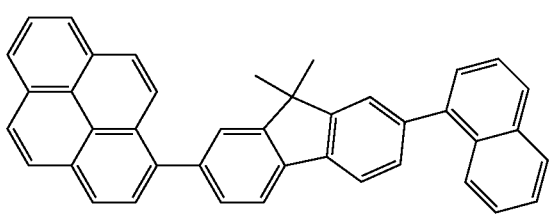
H34
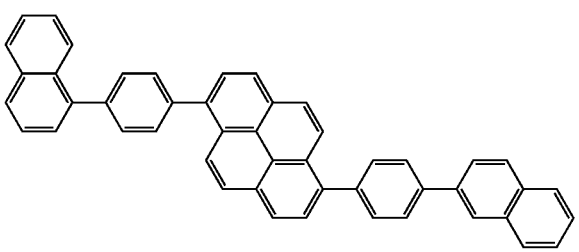

H35
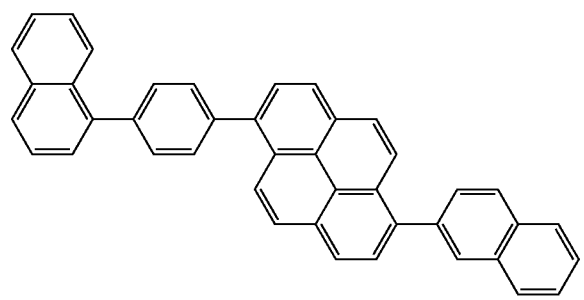
H36
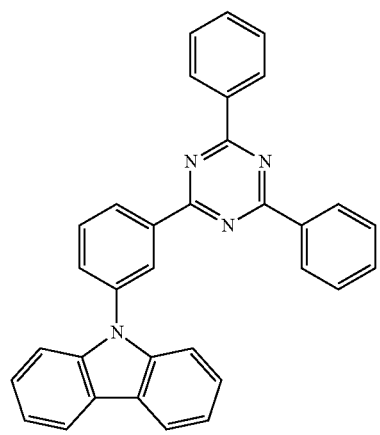
H37
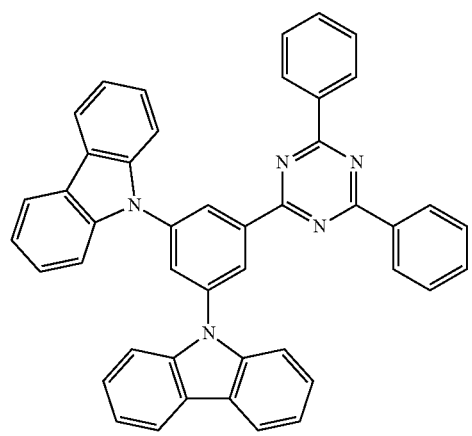
H38
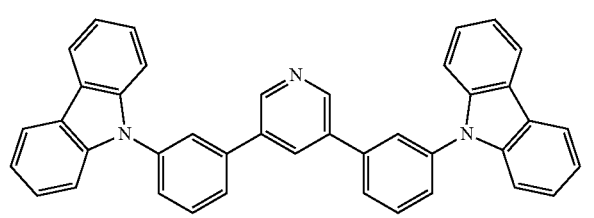
H39
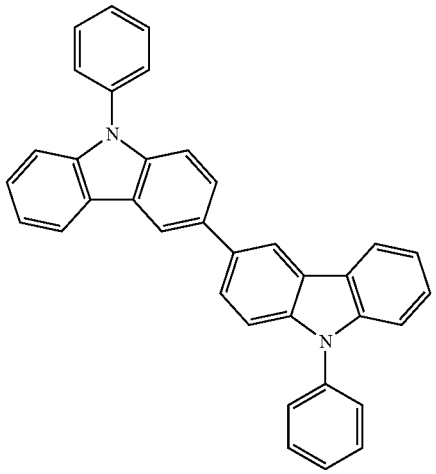
H40
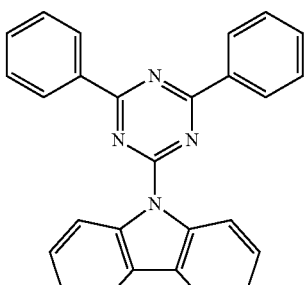
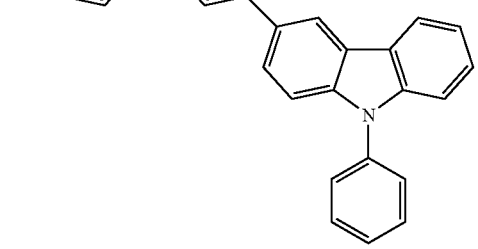
H41
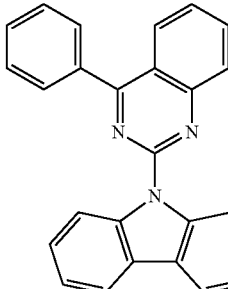
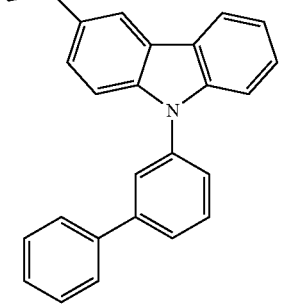

-continued
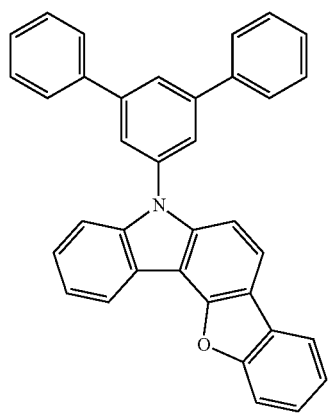
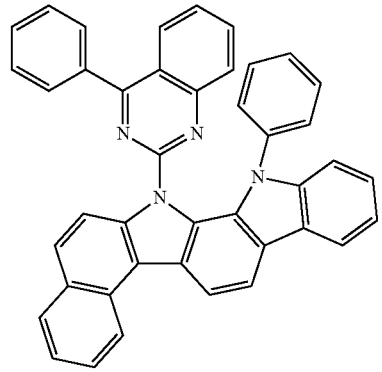H42
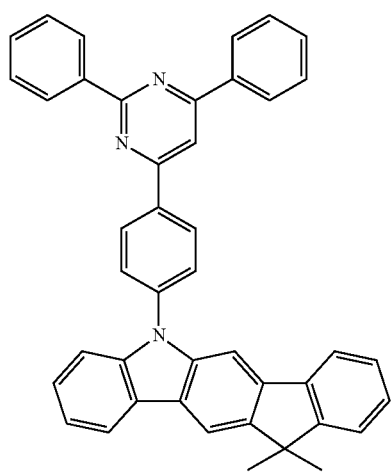H43
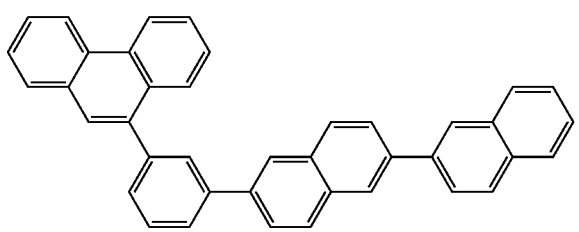H47
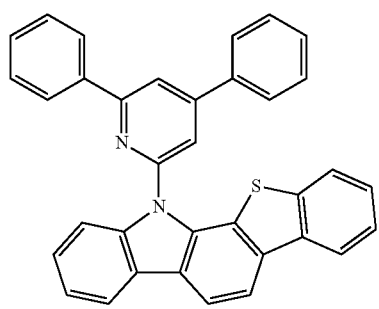H44
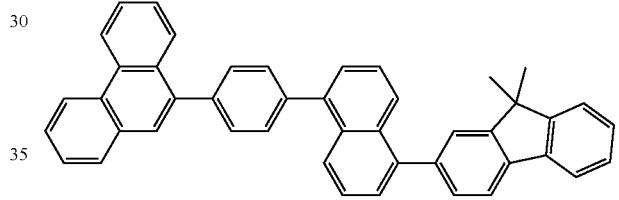H48
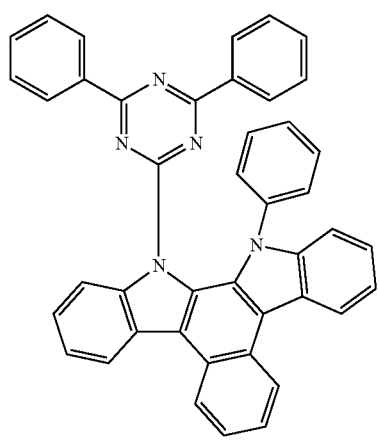
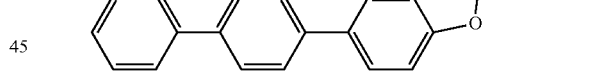H49
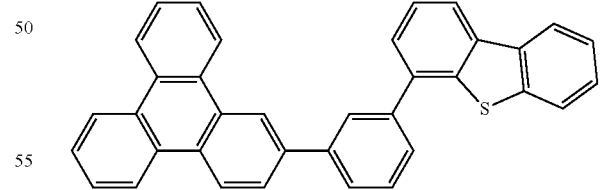H45 H50
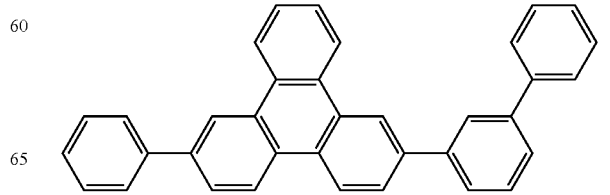H51

-continued

H52
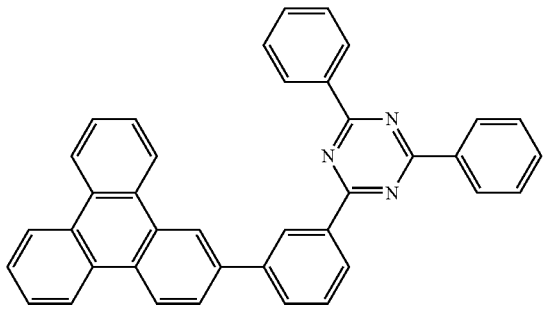

H53
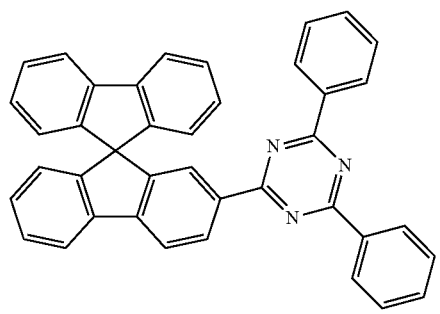

H54
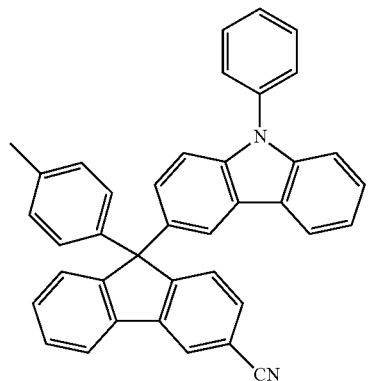

H55
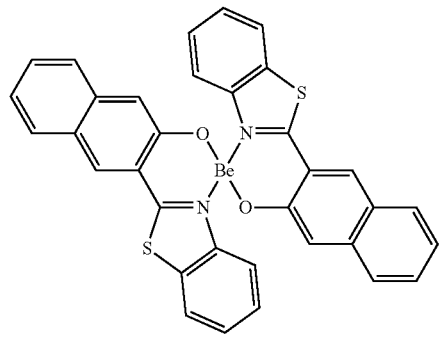

In one or more embodiments, the host may include at least one selected from a silicon-containing compound (for example, BCPDS and/or the like used in Examples below) and a phosphine oxide-containing group (for example, POPCPA and/or the like used in Examples below).

The host may include only one compound, or may include two or more different compounds (for example, the host in Examples below may include BCPDS and POPCPA), in one or more various suitable modifications.

The phosphorescent dopant may include an organometallic complex represented by Formula 401 below:

$$M(L_{401})_{xc1}(L_{402})_{xc2}.$$ Formula 401

Formula 402

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be a ligand represented by Formula 402, and xc1 may be 1, 2, or 3, wherein when xc1 is 2 or more, two or more $L_{401}(s)$ may be identical to or different from each other, $L_{402}$ may be an organic ligand, and xc2 may be an integer from 0 to 4, wherein when xc2 may be two or more, two or more $L_{402}(s)$ may be identical to or different from each other, $X_{401}$ to $X_{404}$ may each independently be nitrogen or carbon, $X_{401}$ and $X_{403}$ may be linked to each other via a single bond or a double bond, and $X_{402}$ and $X_{404}$ may be linked to each other via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and In Formula 402, * and *' each indicate a binding site to M in Formula 401.

In one embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen and $X_{402}$ may be carbon, or ii) $X_{401}$ and $X_{402}$ may each be nitrogen at the same time.

In one or more embodiments, $R_{401}$ and $R_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —$Si(Q_{401})(Q_{402})(Q_{403})$, —$N(Q_{401})(Q_{402})$, —$B(Q_{401})(Q_{402})$, —$C(=O)(Q_{401})$, —$S(=O)_2(Q_{401})$, and —$P(=O)(Q_{401})(Q_{402})$, and $Q_{401}$ to $Q_{403}$ may each independently be selected from a $C_1$-$C_{10}$ alkyl group, a alkoxy group, a phenyl group, a biphenyl group, and a naphthyl group, but embodiments of the present disclosure are not limited thereto.

In one or more embodiments, when xc1 in Formula 401 is 2 or more, two $A_{401}$(s) in two or more $L_{401}$(s) may optionally be linked to each other via $X_{407}$, which is a linking group; two $A_{402}$(s) may optionally be linked to each other via $X_{408}$, which is a linking group (see e.g., Compounds PD1 to PD4 and PD7 below). $X_{407}$ and $X_{408}$ may each independently be a single bond, *—O—*', *—S—*', *—C(=O)—*', *—N($Q_{413}$)-*', *—C($Q_{413}$)($Q_{414}$)-*', or *—C($Q_{413}$)=C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(=O), isonitrile, —CN, and phosphorus (for example, phosphine and/or phosphite), but embodiments of the present disclosure are not limited thereto.

In one or more embodiments, the organometallic phosphorescent dopant may be selected from, for example, Compounds PD1 to PD25 below, but embodiments of the present disclosure are not limited thereto:

PD1
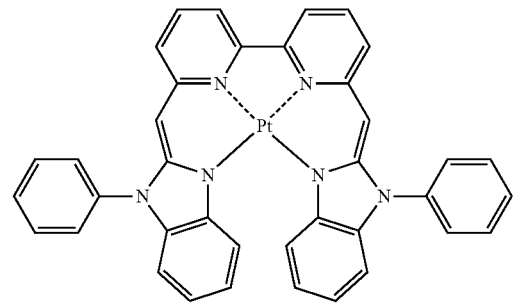

PD2
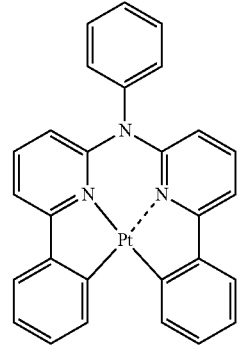

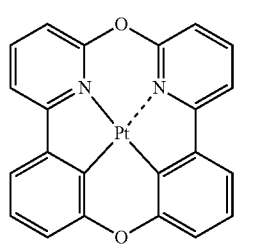
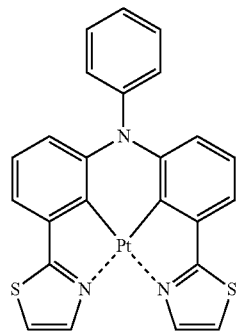
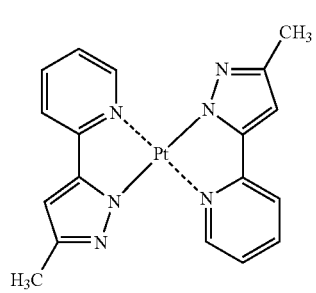
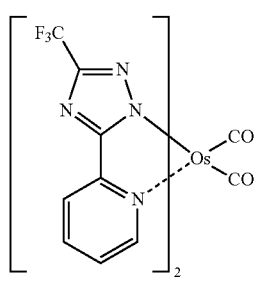
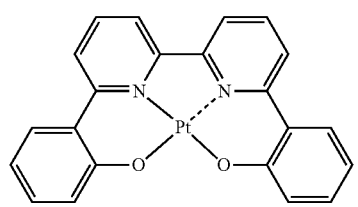
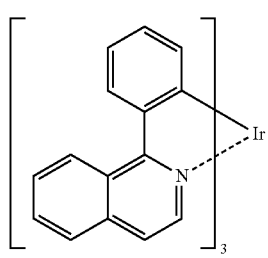
PD3
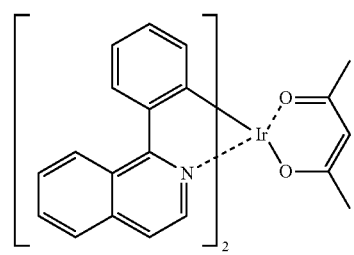
PD4
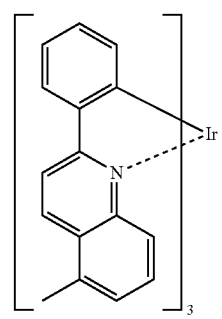
PD5
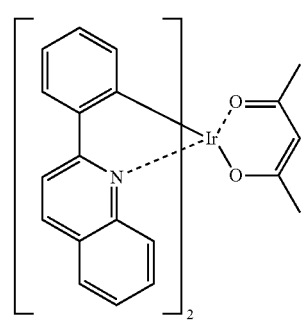
PD6
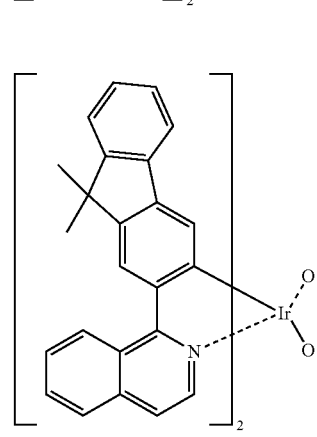
PD7
PD8
PD9
PD10
PD11
PD12
PD13
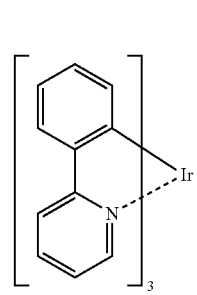

PD14
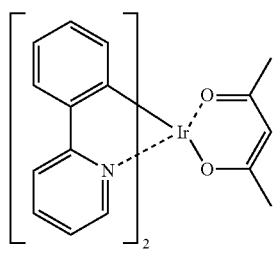
PD15
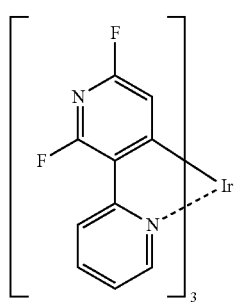
PD16
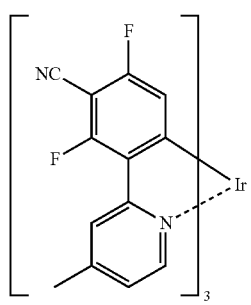
PD17
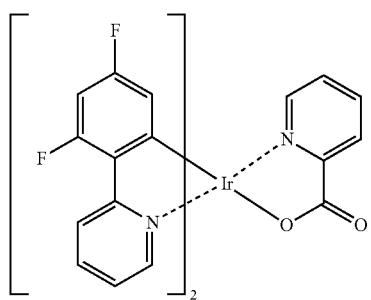
PD18
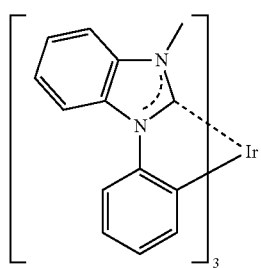
PD19
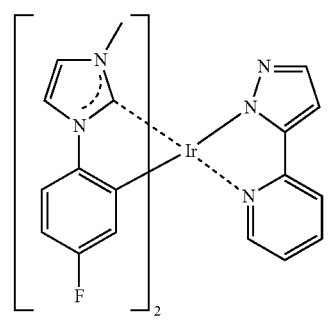
PD20
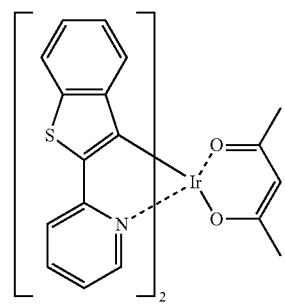
PD21
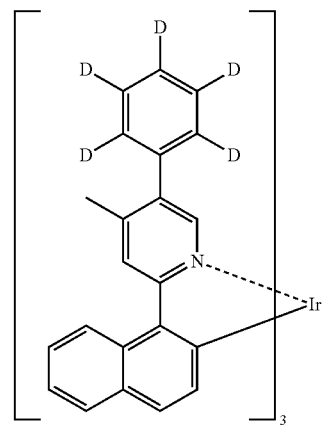
PD22
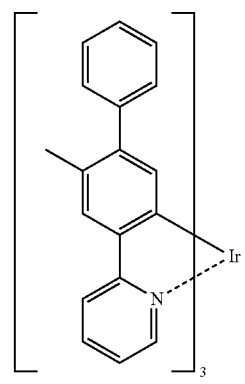

-continued

PD23

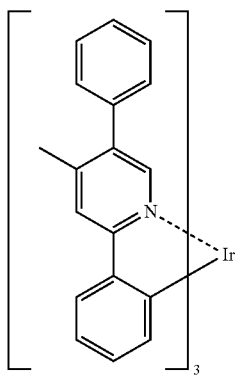

PD24

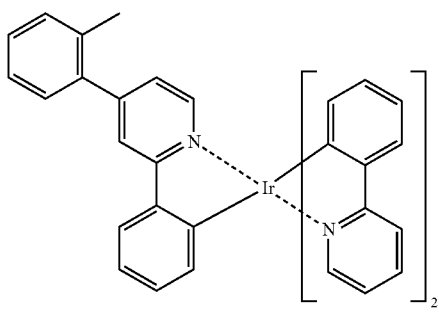

PD25

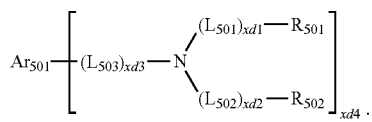

The fluorescent dopant may include an arylamine compound and/or a styrylamine compound.

The fluorescent dopant may include a compound represented by Formula 501 below:

Formula 501

$$Ar_{501}\left[-(L_{503})_{xd3}-N\begin{matrix}(L_{501})_{xd1}-R_{501}\\ (L_{502})_{xd2}-R_{502}\end{matrix}\right]_{xd4}$$

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In one embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an am idino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an am idino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an am idino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —$Si(Q_{31})(Q_{32})(Q_{33})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments of the present disclosure are not limited thereto.

For example, the fluorescent dopant may be selected from Compounds FD1 to FD23 below:

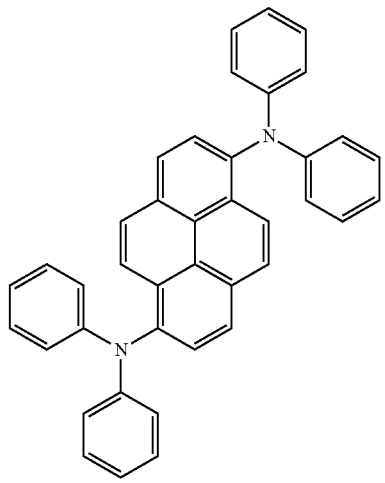

FD1

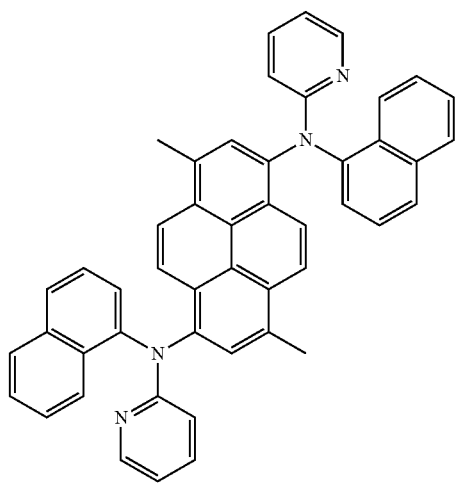

FD2

-continued
FD3
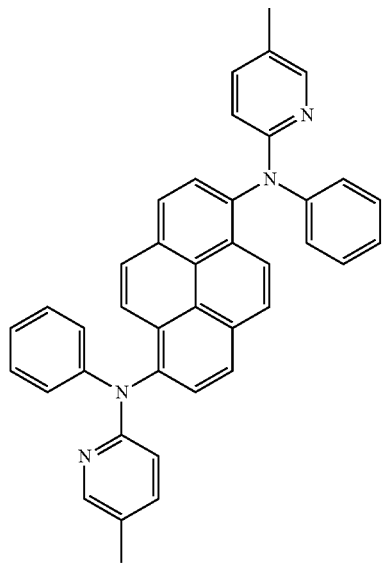
FD6
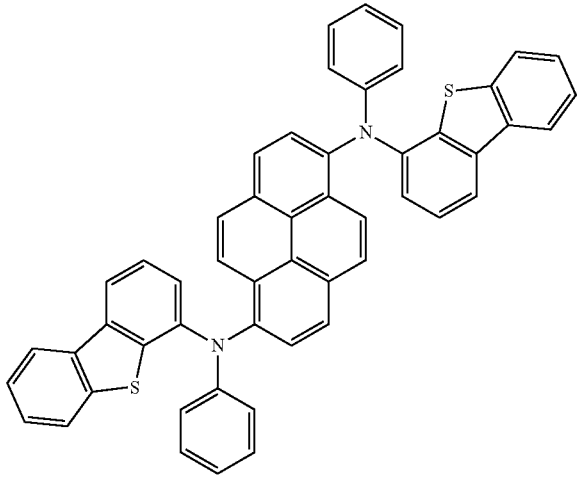
FD4
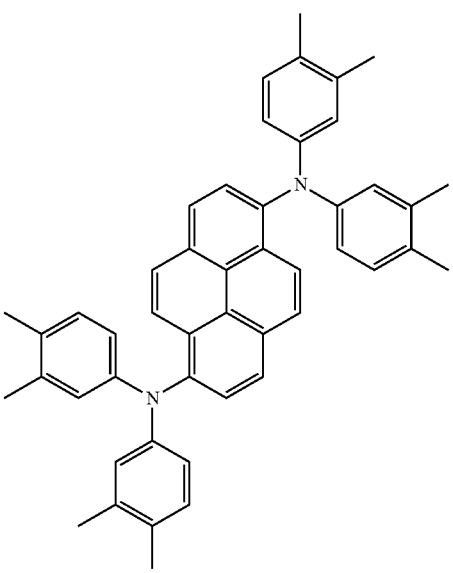
FD7
FD5
FD8
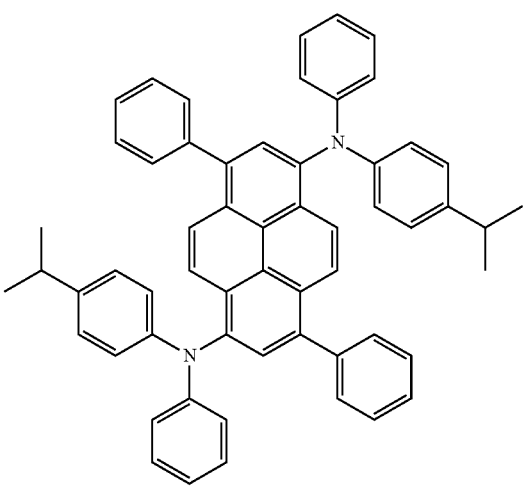

FD9
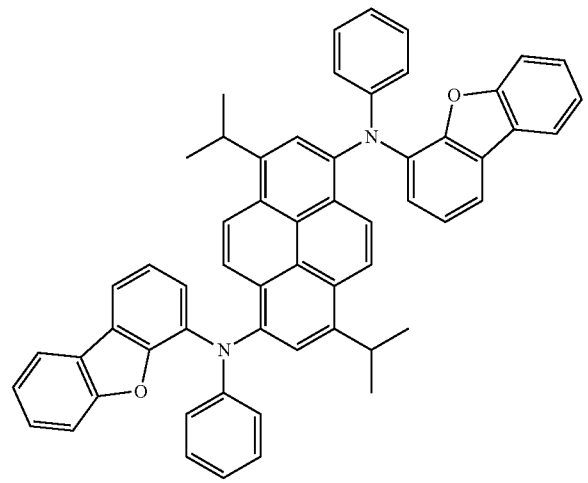
FD10
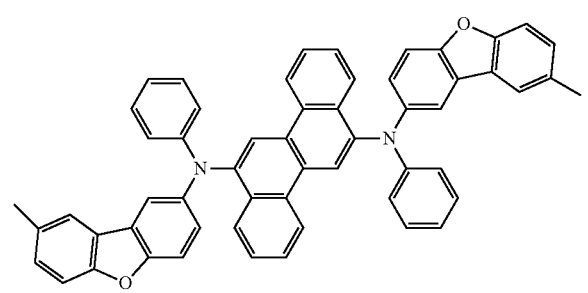
FD11
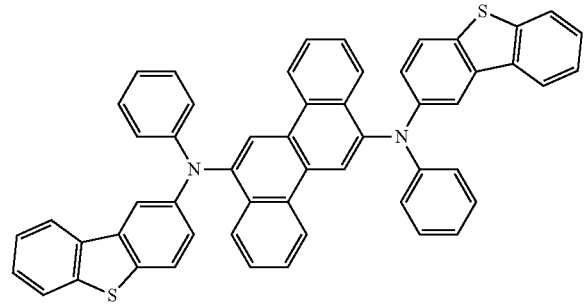
FD12
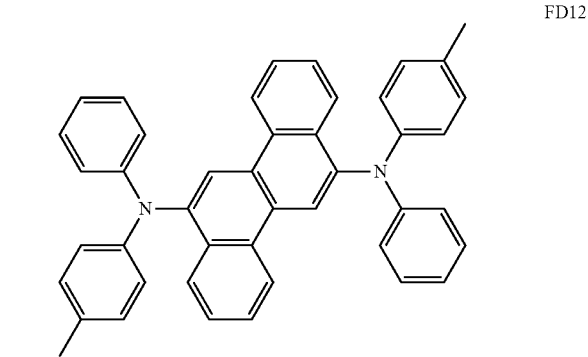
FD13
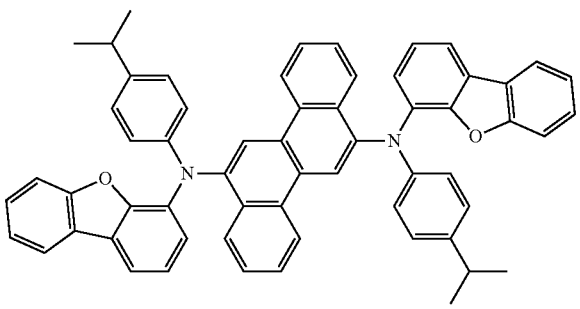
FD14
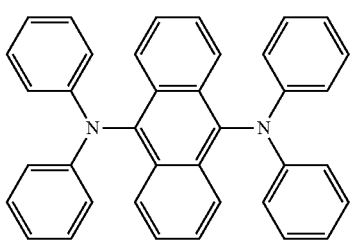
FD15
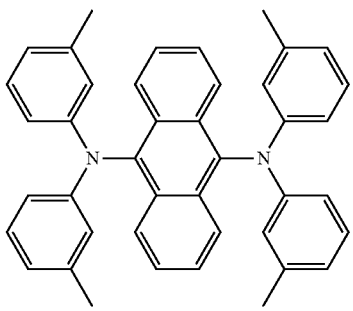
FD16
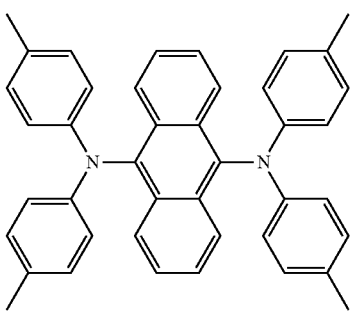
FD17
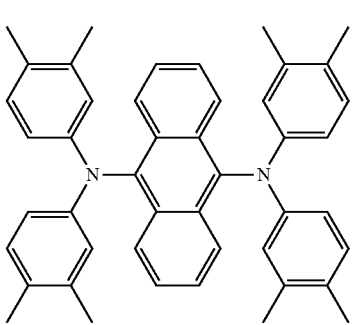

FD18
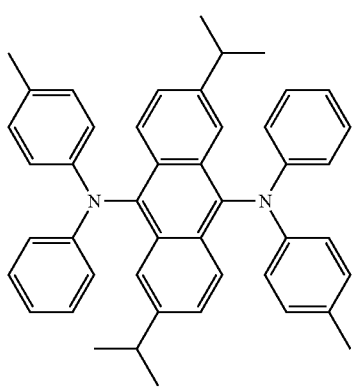
FD19
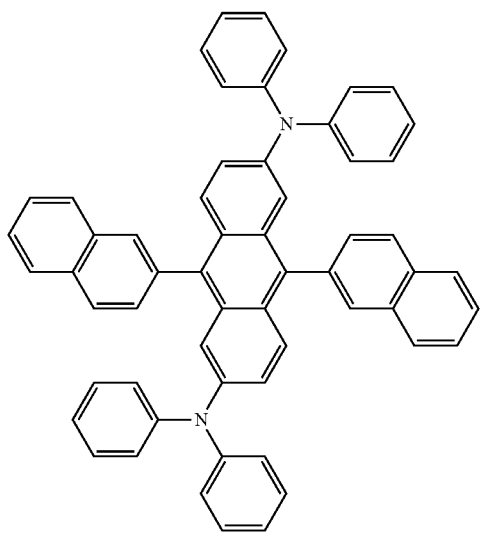
FD20
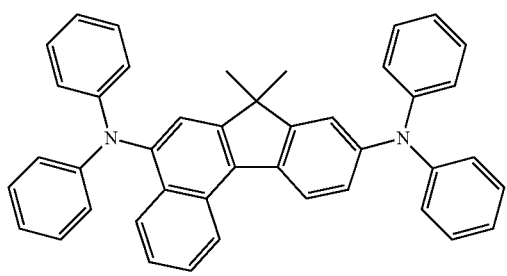
FD21
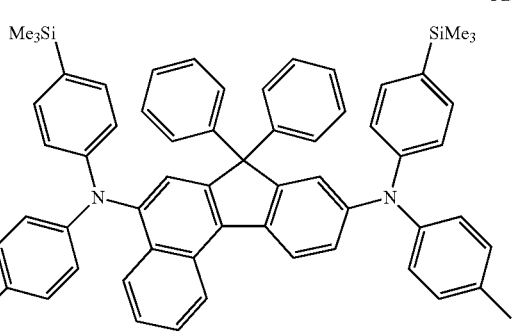
FD22
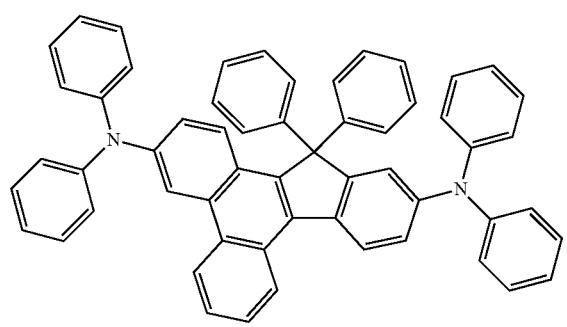
FD23
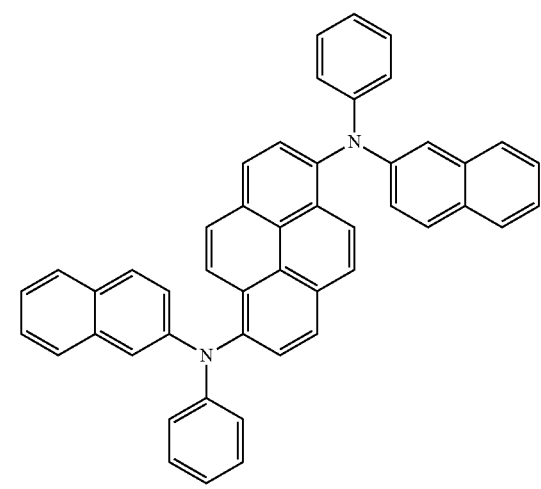
In one or more embodiments, the fluorescent dopant may be selected from the following compounds, but embodiments of the present disclosure are not limited thereto.
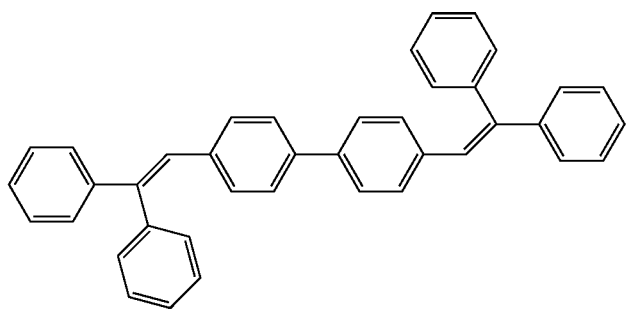
DPVBi

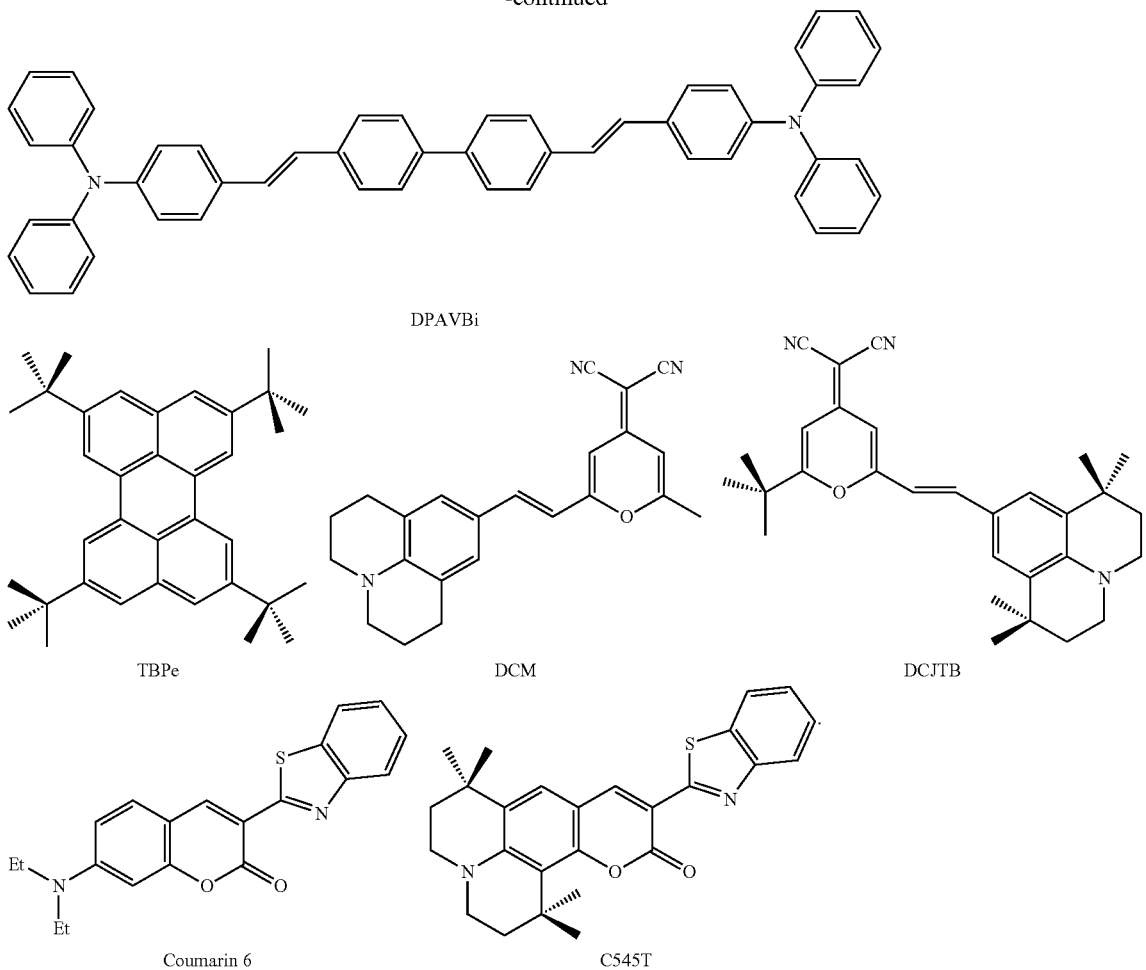

The delayed fluorescence dopant may include a compound represented by Formula 502 below:

Formula 502

In Formula 502, $A_{501}$ to $A_{503}$ may each independently be a $C_5$-$C_{60}$ carbocyclic group or a $C_1$-$C_{60}$ heterocyclic group, $L_{501}$ to $L_{505}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a501 to a505 may each independently be an integer from 0 to 3, $R_{503}$ to $R_{507}$ may each independently be selected from a substituted or unsubstituted $C_3$-$C_{10}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and c11 to c13 may each independently be an integer from 0 to 6.

In one embodiment, $A_{501}$ to $A_{503}$ in Formula 502 may each independently be selected from a benzene group, a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, an indenophenanthrene group, and a group represented by Formula 503 below:

Formula 503

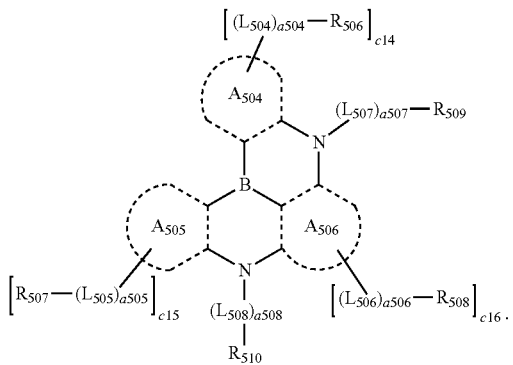

In Formula 503, $A_{504}$ to $A_{506}$ may each be understood by referring to description provided in connection with $A_{501}$ in Formula 502, $L_{504}$ to $L_{508}$ may each be understood by referring to description provided in connection with $L_{501}$ in Formula 502, a504 to a508 may each be understood by referring to description provided in connection with a501 in Formula 502, $R_{506}$ to $R_{510}$ may each be understood by referring to description provided in connection with $R_{503}$ in Formula 502, and c14 to c16 may each be understood by referring to description provided in connection with c11 in Formula 502.

In one or more embodiments, $L_{501}$ to $L_{505}$ in Formula 502 may be understood by referring to the corresponding descriptions thereof provided above.

In one or more embodiments, $R_{503}$ to $R_{507}$ in Formula 502 may each independently be selected from:

a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one embodiment, c11 to c13 in Formula 502 may be 0 or 1, but embodiments of the present disclosure are not limited thereto.

For example, the delayed fluorescence dopant may be selected from Compounds FD23 to FD25 below:

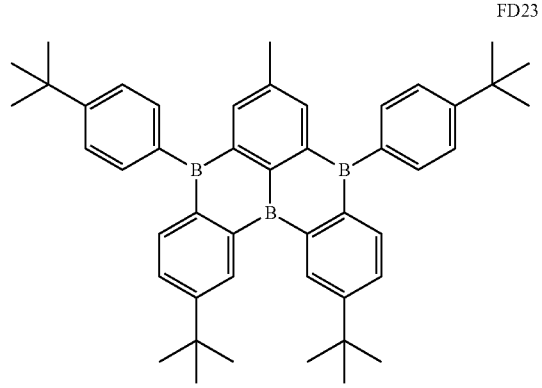

FD23

FD24

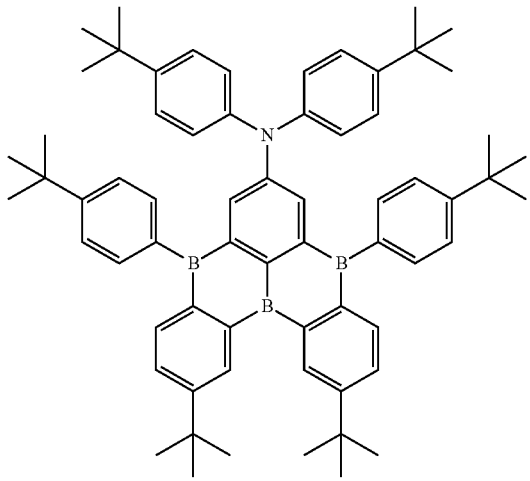

FD25

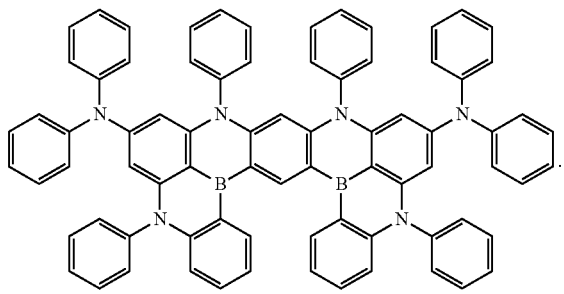

The emission layer of the quantum-dot light-emitting device may include quantum dots. For example, the quantum-dot light-emitting device may include a quantum-dot emission layer. The quantum-dot emission layer may include a plurality of quantum dots (inorganic nanoparticles) arranged in a single layer or a plurality of layers.

The term "quantum dot" as used herein refers to a crystal of a semiconductor compound, and may include any material capable of emitting emission wavelengths of different lengths according to the size of the crystal. Therefore, types (or kinds) of compounds constituting the quantum dot are not particularly limited.

In some embodiments, the quantum dot may include a semiconductor compound material selected from the III-VI group semiconductor compound, the II-VI group semiconductor compound; the III-V group semiconductor compound; the IV-VI group semiconductor compound; the IV group element and/or semiconductor compound; and mixtures thereof.

For example, the III-VI group semiconductor compound may be selected from: a binary compound such as $In_2S_3$; and a ternary compound selected from AgInS, $AgInS_2$, CuInS, $CuInS_2$, and mixtures thereof, but embodiments of the present disclosure are not limited thereto.

For example, the II-VI group semiconductor compound may be selected from a binary compound selected from CdSe, CdTe, ZnS, ZnSe, ZnTe, ZnO, HgS, HgSe, HgTe, MgSe, MgS, and mixtures thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from CdZnSeS, CdZnSeTe, CdZnSTe, CdHgSeS, CdHgSeTe, CdHgSTe, HgZnSeS, HgZnSeTe, HgZnSTe, and mixtures thereof, but embodiments of the present disclosure are not limited thereto.

For example, the III-V group semiconductor compound may be selected from: a binary compound selected from GaN, GaP, GaAs, GaSb, AlN, AlP, AlAs, AlSb, InN, InP, InAs, InSb, and mixtures thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and mixtures thereof; and a quaternary compound selected from GaANAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof, but embodiments of the present disclosure are not limited thereto.

For example, the IV-VI group semiconductor compound may be selected from: a binary compound selected from SnS, SnSe, SnTe, PbS, PbSe, PbTe, and mixtures thereof; a ternary compound selected from SnSeS, SnSeTe, SnSTe, PbSeS, PbSeTe, PbSTe, SnPbS, SnPbSe, SnPbTe, and mixtures thereof; and a quaternary compound selected from selected from SnPbSSe, SnPbSeTe, SnPbSTe, and mixtures thereof, but embodiments of the present disclosure are not limited thereto.

For example, the IV group element and/or compound may be selected from: a single element selected from Si, Ge, and mixtures thereof; and a binary compound selected from SiC, SiGe, and mixtures thereof, but embodiments of the present disclosure are not limited thereto.

The binary compound, the ternary compound, and/or the quaternary compound may exist in particles at uniform concentration, or may exist in the same particle in a state in which a concentration distribution is partially different.

The quantum dot may have a uniform single structure or a double core-shell structure. For example, the core-sell may include different materials. For example, materials constituting each of the core and the shell may include different semiconductor compounds.

The shell of the quantum dot may serve as a protective layer for maintaining semiconductor characteristics by preventing (or reducing) chemical degeneration of the core, and/or may serve as a charging layer for imparting electrophoretic characteristics to the quantum dot. The shell may be a single layer or a multilayer. An interface between the core and the shell may have a concentration gradient in which the concentration of atoms existing in the shell decreases toward the center.

Examples of the shell of the quantum dot may include a metal oxide, a non-metal oxide, a semiconductor compound, and any combination thereof. For example, the metal or non-metal oxide may include a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO), or a ternary compound (such as $MgAl_2O_4$, $CoFe_2O_4$, $NiFe_2O_4$, and/or $CoMn_2O_4$), but embodiments of the present disclosure are not limited thereto. In some embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like, but embodiments of the present disclosure are not limited thereto.

A diameter of the quantum dot is not particularly limited, but may be, for example, in a range of about 1 nm to about 10 nm. By adjusting the size of the quantum dot, the energy band gap may be also adjusted, thereby obtaining light of various wavelengths in the quantum-dot emission layer.

Therefore, by using quantum dots of different sizes, a display that emits light of various suitable wavelengths may be implemented.

In some embodiments, the size of quantum dots may be selected to emit red, green, and blue light, so as to constitute a color display. In addition, the size of quantum dots may be configured by combining light of various colors, so as to emit white light.

The quantum dot may be, for example, a spherical, pyramidal, multi-arm, and/or cubic nanoparticle, nanotube, nanowire, nanofiber, and/or nanoplate particle, but embodiments of the present disclosure are not limited thereto.

A full width of half maximum (FWHM) of an emission wavelength spectrum of the quantum dot may be about 45 nm or less, for example, about 40 nm or less, for example, about 30 nm or less. When the FWHM of the emission wavelength spectrum of the quantum dot is within this range, color purity and/or color reproduction may be improved. In addition, light emitted through such quantum dot is irradiated in omnidirection, thereby improving a wide viewing angle.

The quantum dots may be synthesized by a wet chemical process, an organometallic chemical vapor deposition process, a molecular beam epitaxy process, or any suitable process.

According to the wet chemical process, a precursor material is added to an organic solvent to grow particle crystals. When the crystal grows, the organic solvent serves as a dispersant naturally coordinated to the surface of the quantum dot crystal and controls the growth of the crystal. In this regard, the wet chemical process may be easily performed compared to a vapor deposition process, such as metal organic chemical vapor deposition (MOCVD) and/or molecular beam epitaxy (MBE), and through a low-cost process, the growth of inorganic nanoparticles may be controlled.

Electron Transport Layer in Electron Transport Region

The light-emitting device may include an electron transport layer that is in direct contact with the emission layer.

The electron transport layer may include a twelfth material and a thirteenth material, wherein the twelfth material and the thirteenth material may be different from each other, the twelfth material may include at least one selected from electron-transporting organic compounds, and the thirteenth material may include a halide of alkaline earth metal, a halide of lanthanoid metal, or any combination thereof.

The term "electron-transporting organic compound" as used herein refers to a metal-free compound including at least one π electron-depleted nitrogen-containing ring.

The "π electron-depleted nitrogen-containing ring" indicates a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups, each having at least one *—N=*' moiety, are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, a thiadiazole, an imidazopyridine, an imidazopyrimidine, and an azacarbazole, but are not limited thereto.

In some embodiments, the "electron-transporting organic compound" may include a compound represented by Formula 601 below:

Formula 601

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(s) in the number of xe11 and $R_{601}$(s) in the number of xe21 may include the π electron-depleted nitrogen-containing ring.

In one embodiment, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an am idino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more Ar$_{601}$(s) may be linked to each other via a single bond.

In one or more embodiments, Ar$_{601}$ in Formula 601 may be an anthracene group.

In one or more embodiments, the compound represented by Formula 601 may be represented by Formula 601-1 below:

Formula 601-1

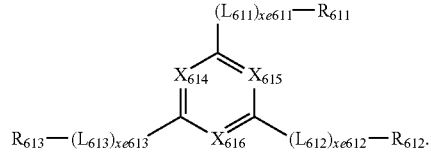

In Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each be understood by referring to description provided in connection with $L_{601}$, xe611 to xe613 may each be understood by referring to description provided in connection with xe1, $R_{611}$ to $R_{613}$ may each be understood by referring to description provided in connection with $R_{601}$, and $R_{614}$ to $R_{616}$ may each independently be selected from hydrogen, deuterium, —F, —Cl, —Br, —I, a hydroxyl group, a cyano group, a nitro group, an am idino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an am idino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), and Q$_{601}$ and Q$_{602}$ are the same as described above.

The electron transport region may include at least one compound selected from Compounds ET1 to ET38 below, but embodiments of the present disclosure are not limited thereto:

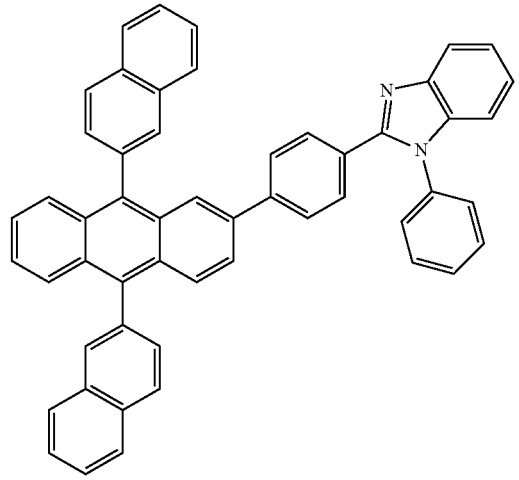

ET1

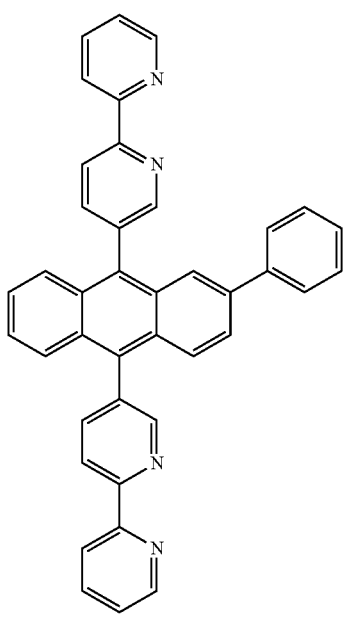
ET2
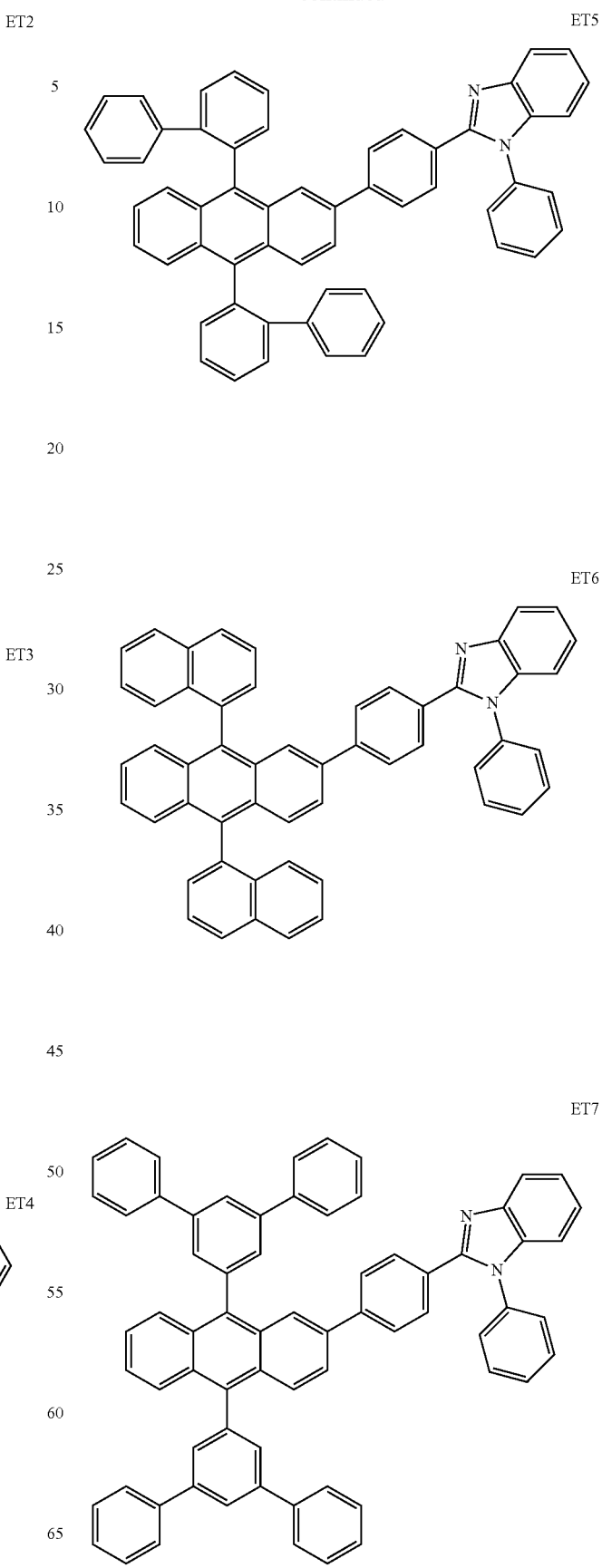

ET8
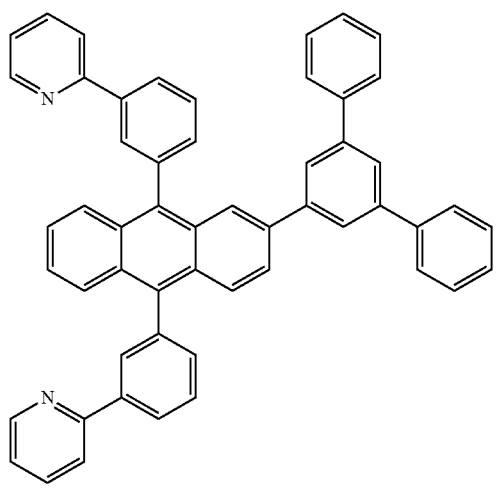
ET10
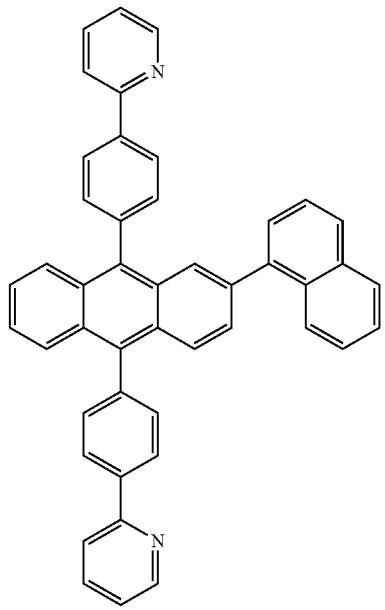
ET11
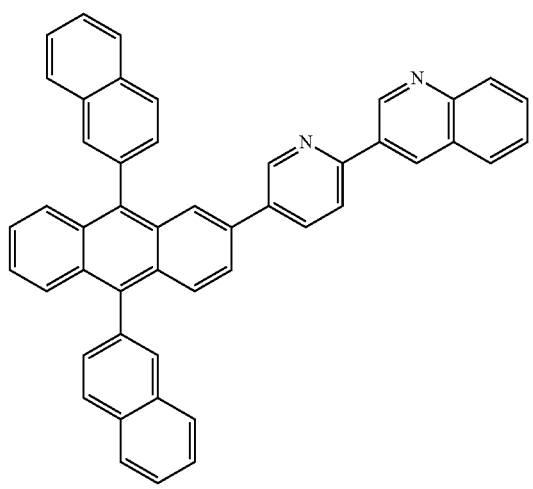
ET9
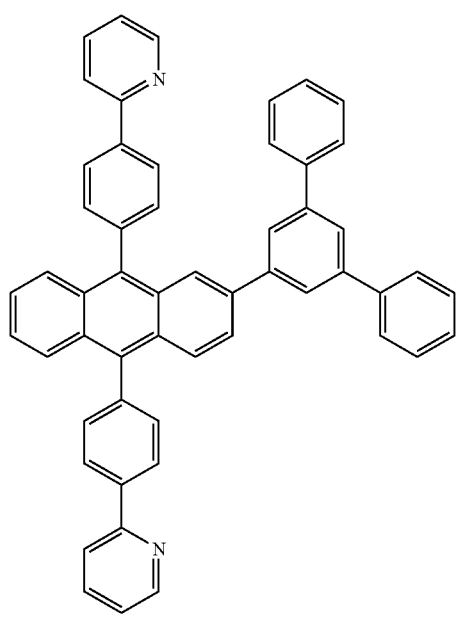
ET12
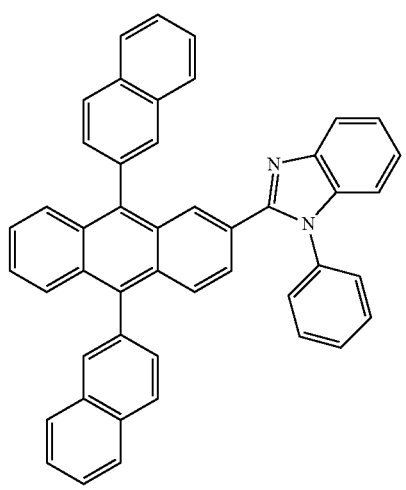

ET13
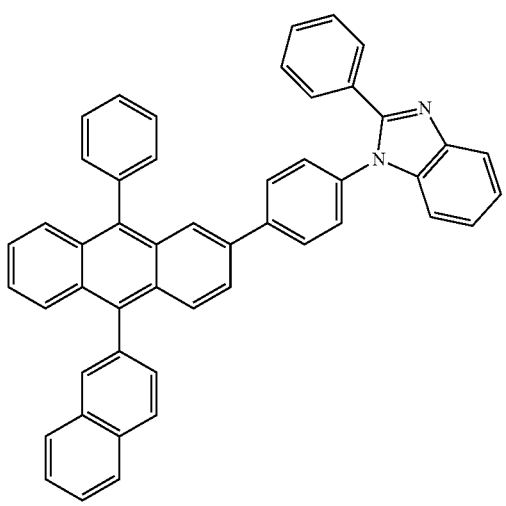
ET16
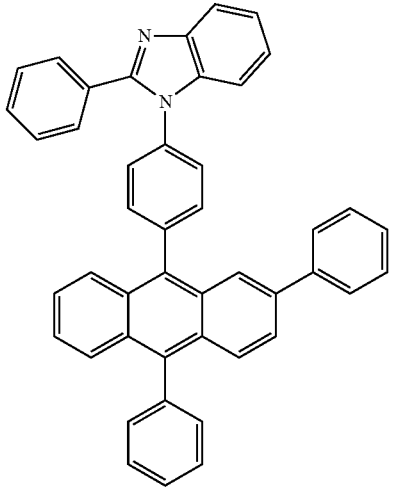
ET14
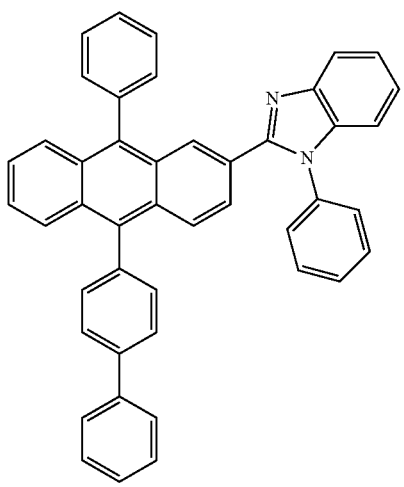
ET17
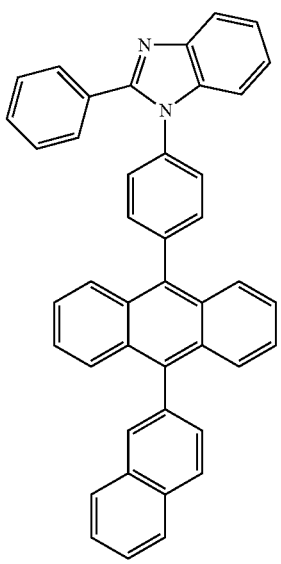
ET15
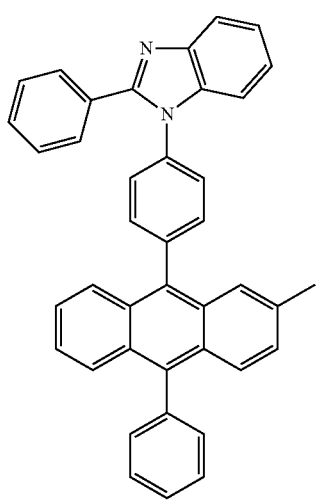
ET18
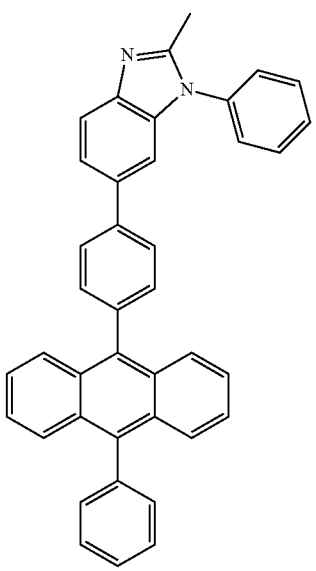

ET19
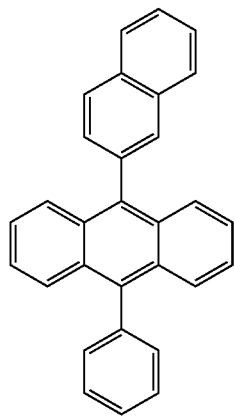
ET20
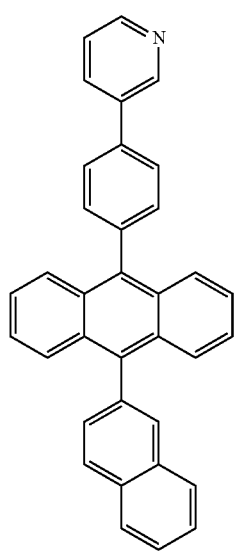
ET21
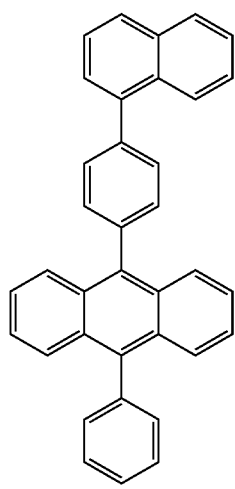
ET22
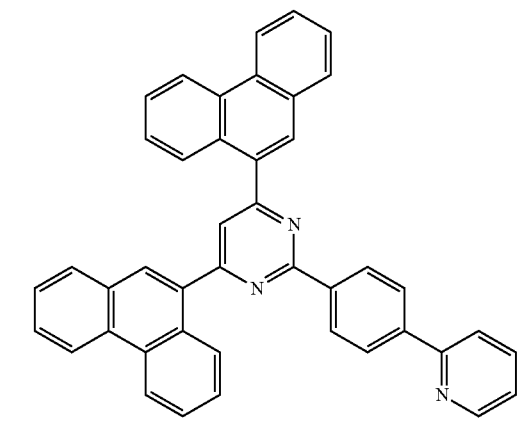
ET23
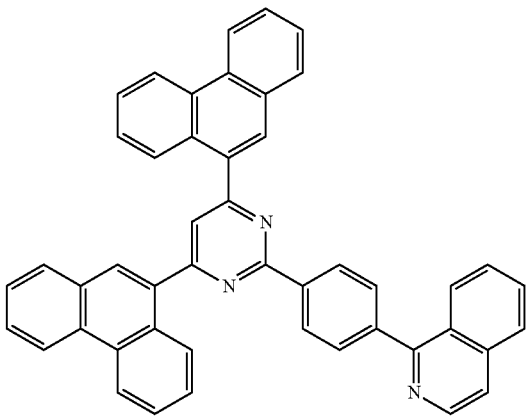
ET24

ET25
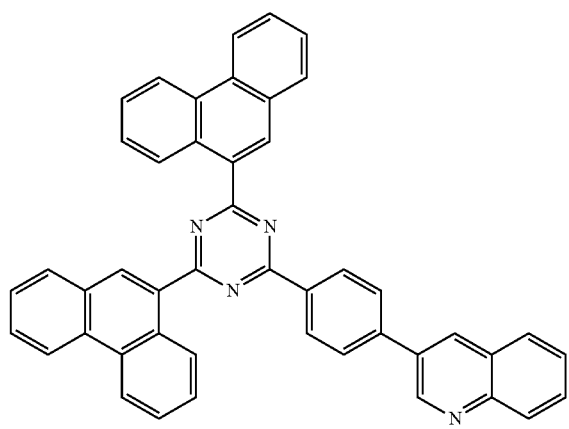
ET26
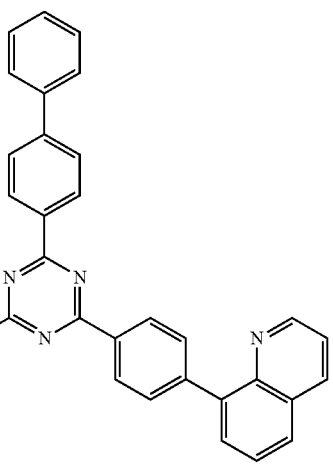
ET27
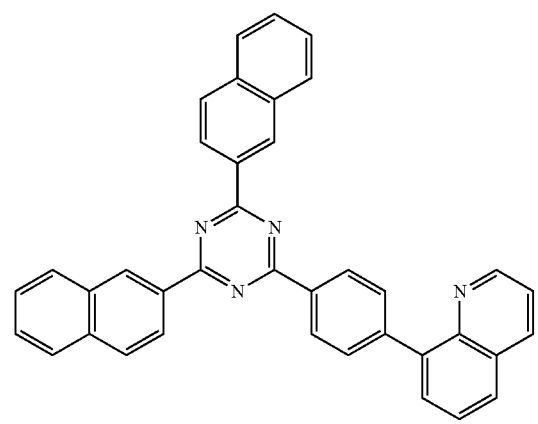
ET28
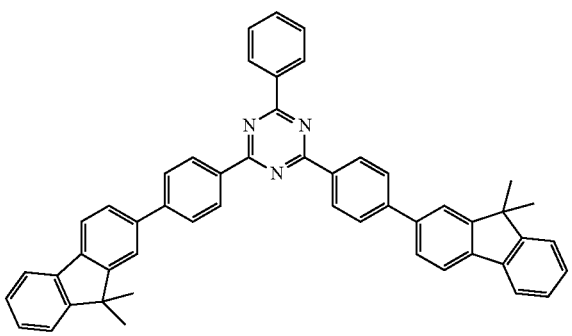
ET29
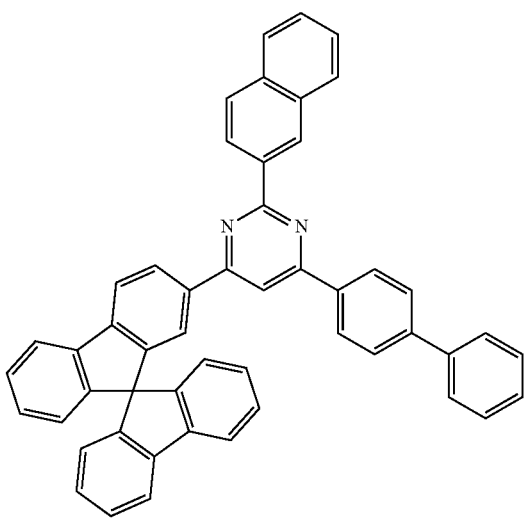
ET30
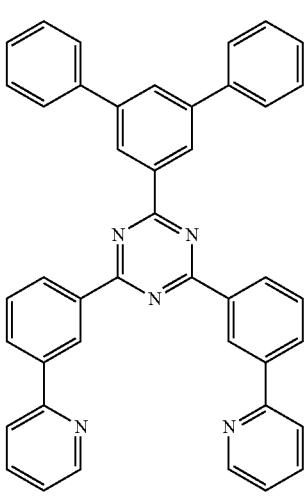

ET31
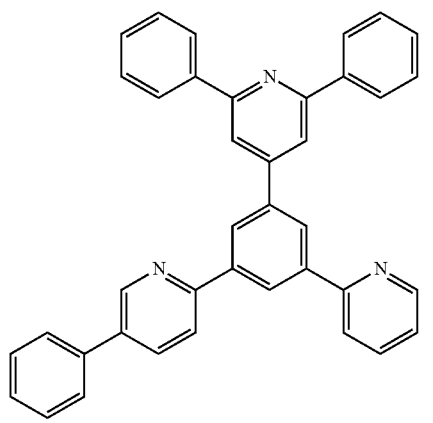
ET32
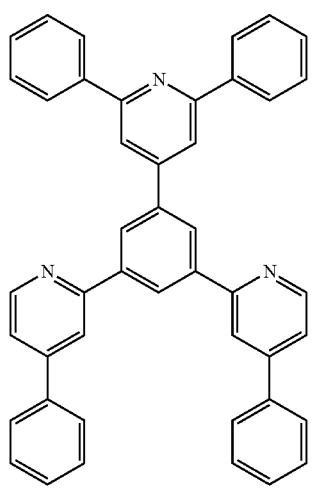
ET33
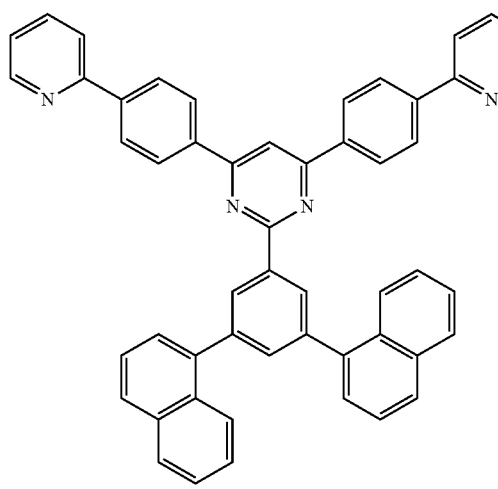
ET34
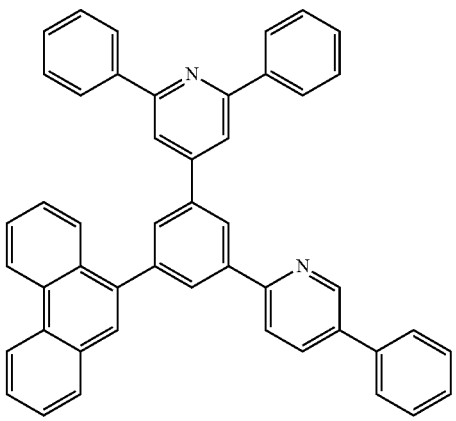
ET35
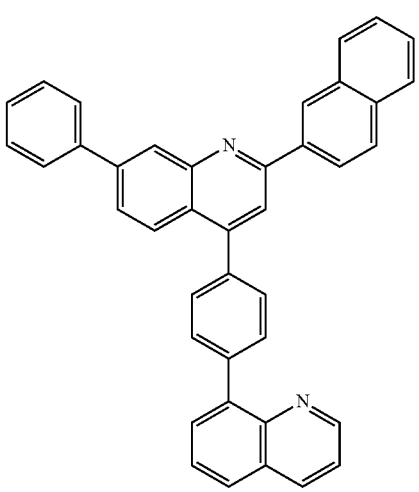
ET36
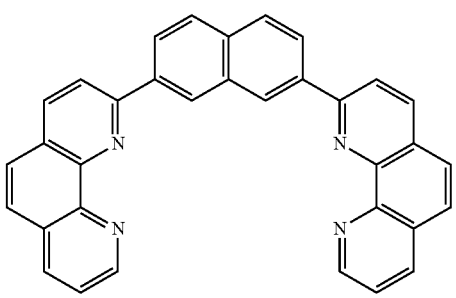
ET37
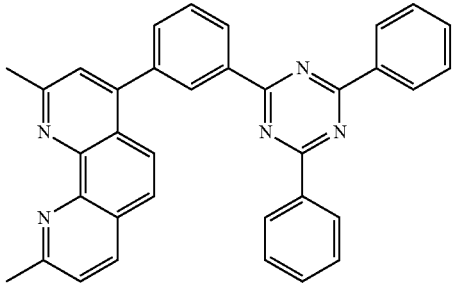

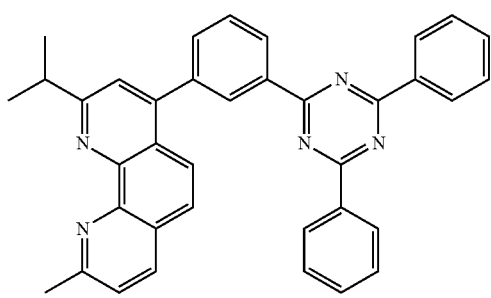

ET38

In one or more embodiments, the electron transport region may include at least one selected from 2,9-dimethyl-4,7-diphenyl-1,10-phenanthroline (BCP), 4,7-dphenyl-1,10-phenanthroline (Bphen), Alq$_3$, BAlq, 3-(biphenyl-4-yl)-5-(4-tert-butylphenyl)-4-phenyl-4H-1,2,4-triazole (TAZ), NTAZ, T2T, and TPM-TAZ below:

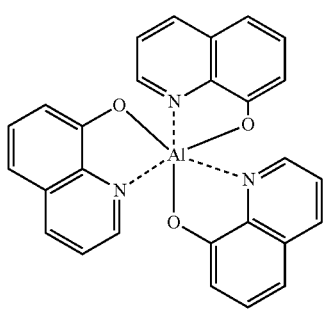

Alq$_3$

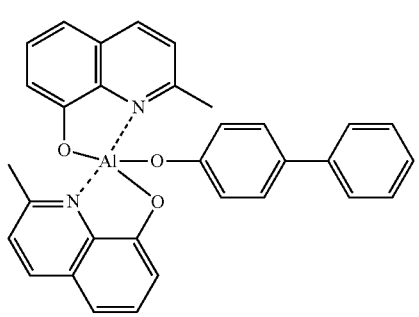

BAlq

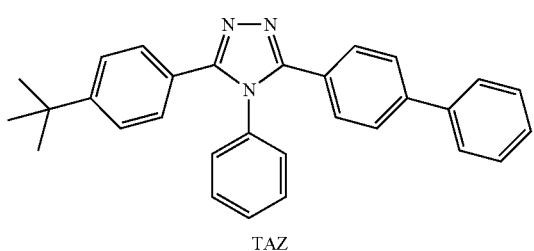

TAZ

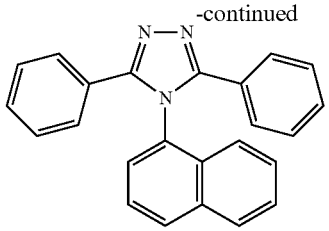

NTAZ

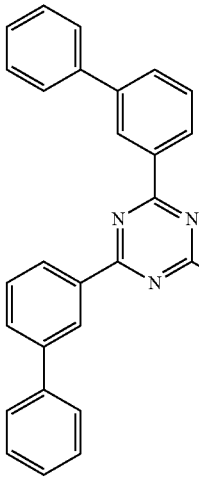

T2T

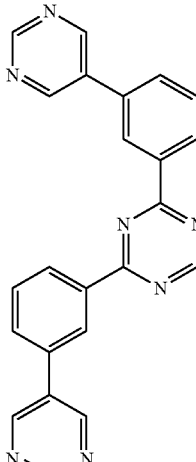

TPM-TAZ

In the electron transport layer, the volume of the twelfth material may be greater than that of the thirteenth material. In some embodiments, a volume ratio of the twelfth material to the thirteenth material in the electron transport layer may be in a range of about 99:1 to about 50:50.

A thickness of the electron transport layer may be in a range of about 0.1 nm to about 10 nm. When the thickness of the electron transport layer is within the range above, satisfactory (or suitable) electron transport characteristics may be obtained without a substantial increase in driving voltage.

Electron Injection Layer in Electron Transport Region

The light-emitting device may include an electron injection layer between the second electrode and the n$^{th}$ emission layer or between the n−1$^{th}$ charge-generation unit and the n−1$^{th}$ emission layer.

The electron injection layer may include an eighth material, and the eighth material may include a halide of alkali metal, a halide of alkaline earth metal, a halide of lanthanoid metal, or any combination thereof.

In one embodiment, the electron injection layer may include (e.g., may consist of) the eighth material. In some embodiments, the electron injection layer may not include any material other than the eighth material.

In another embodiment, the electron injection layer may further include a ninth material, the eighth material and the ninth material may be different from each other, and the ninth material may include alkali metal, alkaline earth metal, lanthanoid metal, or any combination thereof.

In some embodiments, the eighth material may be a compound having a wide band gap of about 7 eV or more. Accordingly, the eighth material may not substantially absorb light.

In some embodiments, the ninth material may have a compound having a low work function of about 2.6 eV or less.

For example, the eighth material may be represented by Formula X, and the ninth material may be represented by Formula Y:

$$A_nB_m \quad \text{Formula X}$$

$$C. \quad \text{Formula Y}$$

In Formulae X and Y,

A and C may each independently include alkali metal, alkaline earth metal, lanthanoid metal, or any combination thereof, B may be halogen, n and m may each independently be an integer of 1 or more to make the eighth material neutral (e.g., the sum of n and m is such that the eighth material has a neutral charge), and A and C may be different from each other.

When A and C are different from each other, the ninth material may complement light absorption according to a narrow band gap of the eighth material.

For example, in Formulae X and Y, A may include Li, Na, K, Rb, Cs, or any combination thereof; B may include F, Cl, Br, I, or any combination thereof; n and m may each be 1; and C may include La, Ce, Pr, Nd, Pm, Sm, Eu, Gd, Tb, Dy, Ho, Er, Tm, Yb, Lu, or any combination thereof.

In some embodiments, the eighth material may include NaI, KI, RbI, CsI, NaCl, KCl, RbCl, CsCl, NaF, KF, RbF, CsF, or any combination thereof; and the ninth material may include La, Ce, Pr, Nd, Pm, Sm, Eu, Gd, Tb, Dy, Ho, Er, Tm, Yb, Lu, or any combination thereof.

In the electron injection layer, a volume of the eighth material may be equal to or greater than a volume of the ninth material. In some embodiments, a volume of the ninth material in the electron injection layer may be greater than 0% and less than or equal to 50%. For example, the volume of the ninth material in the electron injection layer may be 5% or more to 10% or less, but embodiments are not limited thereto. When the volume of the ninth material is within the range above, the ninth material may be sufficient (or suitable) to complement light absorption according to a narrow band gap of the eighth material.

A thickness of the electron injection layer may be in a range of about 0.1 nm to about 5 nm. When the thickness of the electron injection layer is within the range above, satisfactory (or suitable) electron injection characteristics may be obtained without a substantial increase in driving voltage.

Metal-Containing Material in Electron Transport Region

The electron transport region may further include, in addition to the materials described above, a metal-containing material.

The metal-containing material may include at least one selected from an alkali metal complex and an alkaline earth-metal complex.

A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) and/or Compound ET-D2 below:

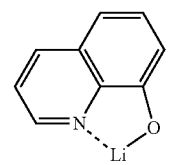

ET-D1

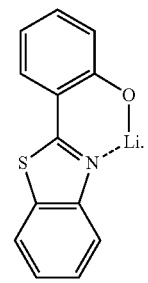

ET-D2

Charge-Generation Unit

The light-emitting device includes a charge-generation unit(s) in the number of n−1 between the adjacent light-emitting units.

In some embodiments, an n−1$^{th}$ charge-generation unit is included between the n$^{th}$ light-emitting unit and the n−1$^{th}$ light-emitting unit. For example, when n is 2, a first electrode, a first light-emitting unit, a first charge-generation unit, and a second light-emitting unit are sequentially positioned. For another example, when n is 3, a first electrode, a first light-emitting unit, a first charge-generation unit, a second light-emitting unit, a second charge-generation unit, and a third light-emitting unit are sequentially positioned.

At least one of the charge-generation unit(s) essentially includes an interlayer between an n-type charge-generation layer and a p-type charge-generation layer. In some embodiments, at least one of the charge-generation unit(s) includes an n-type charge-generation layer, a p-type charge-generation layer, and an interlayer between the n-type charge-generation layer and the p-type charge-generation layer.

Figure 2:
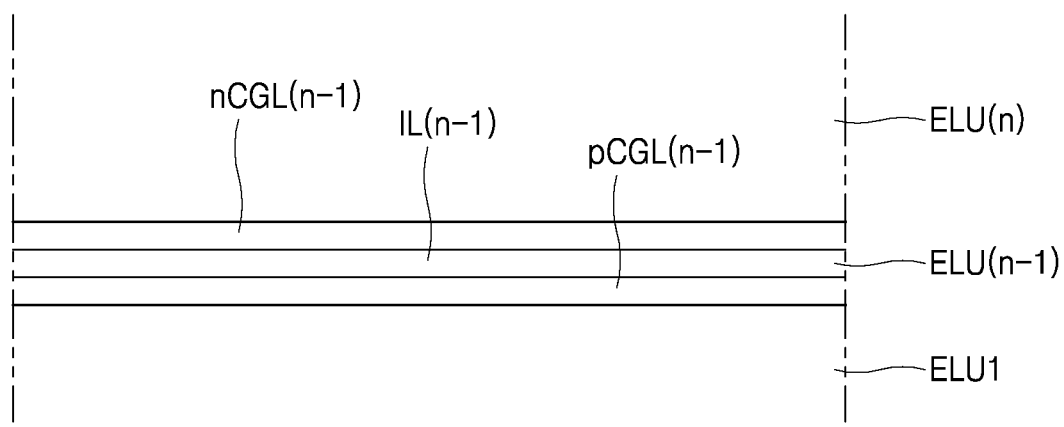
FIG. 2 is a detailed cross-sectional view of charge-generation units of FIG. 1.

Referring to FIG. 2, an n−1$^{th}$ charge-generation unit (CGU (n−1), see FIG. 1) includes an n−1$^{th}$ n-type charge-generation layer (nCGL (n−1)), an n−1$^{th}$ p-type charge-generation layer (pCGL (n−1)), and an n−1$^{th}$ interlayer (IL (n−1)) between the n−1$^{th}$ n-type charge-generation layer and the n−1$^{th}$ p-type charge-generation layer.

The p-type charge-generation layer includes a first material and a second material.

The first material may include a hole-transporting organic compound, an inorganic insulation compound, or any combination thereof. The hole-transporting organic compound may be understood by referring to the corresponding description thereof provided herein.

The second material may include at least one selected from an inorganic semiconductor compound.

A volume of the first material may be equal to or greater than that of the second material.

In one embodiment, the first material may include a hole-transporting organic compound, and a volume ratio of the first material to the second material may be in a range of about 99:1 to about 80:20, but embodiments are not limited thereto.

In another embodiment, the first material may include an inorganic insulation compound, and a volume ratio of the first material to the second material may be in a range of about 99:1 to about 50:50, but embodiments are not limited thereto.

A thickness of the p-type charge-generation layer may be in a range of about 0.1 nm to about 20 nm.

The interlayer may include (e.g., may consist of) a third material.

The third material may be one compound selected from an organic compound, an inorganic semiconductor compound, and inorganic insulation compound.

In some embodiments, the third material may be an organic compound, but embodiments are not limited thereto.

For example, a band gap of the third material may be about 2.5 eV or more, for example, about 4.0 eV or more, but embodiments are not limited thereto.

For another example, the third material may be an organic insulation compound.

For another example, the third material may include at least one selected from a quinone derivative (such as TCNQ (tetracyanoquinodimethane) and/or F4-TCNQ (2,3,5,6-tetrafluoro-7,7,8,8-tetracyanoquinodimethane)), HAT-CN (1,4,5,8,9,11-hexaazatriphenylene-hexacarbonitrile), and a compound represented by Formula 221, but embodiments are not limited thereto.

A lowest unoccupied molecular orbital (LUMO) energy level of the third material may be about −4.5 eV to about −6.5 eV. In some embodiments, the LUMO energy level of the third material may be about −4.5 eV to about −5.5 eV, but embodiments are not limited thereto. When the LUMO energy level of the third material is within the range above, a forth material included in an n-type charge-generation layer may be prevented (or reduced) from diffusing into a p-type charge-generation layer.

A thickness of the interlayer may be in a range of about 0.1 nm to about 20 nm.

The n-type charge-generation layer may include a fourth material and a fifth material.

The fourth material may include alkali metal, alkaline earth metal, lanthanoid metal, transition metal, late transition metal, or any combination thereof.

The fifth material may include at least one selected from electron-transporting organic compounds. The electron-transporting organic compound may be understood by referring to the corresponding description thereof provided herein.

A LUMO energy level of the fifth material may be smaller than the LUMO energy level of the third material. In some embodiments, a difference between the LUMO energy level of the fifth material and the LUMO energy level of the third material may be about 1 eV or less. When the difference between the LUMO energy level of the fifth material and the LUMO energy level of the third material is within the above range, an electron generated from the n-type charge-generation layer may be well (suitably) transmitted via the interlayer.

A thickness of the n-type charge-generation layer may be in a range of about 0.1 nm to about 20 nm.

The n-type charge-generation layer may be in direct contact with the interlayer.

In some embodiments, the n-type charge-generation layer may be in direct contact with an electron injection layer or an electron transport layer. For example, the n-type charge-generation layer included in an n−1$^{th}$ charge-generation unit may be in direct contact with an electron injection layer, or an electron transport layer, included in an n−1$^{th}$ light-emitting unit.

The p-type charge-generation layer may be in direct contact with the interlayer.

In some embodiments, the p-type charge-generation layer may be in direct contact with a hole injection layer or a hole transport layer. For example, the p-type charge-generation layer included in an n−1$^{th}$ charge-generation unit may be in direct contact with a hole injection layer, or a hole transport layer, included in an n$^{th}$ light-emitting unit.

When a voltage is applied to the light-emitting device, the fourth material included in the n-type charge-generation layer may be diffused to the p-type charge-generation layer. However, the interlayer between the n-type charge-generation layer and the p-type charge-generation layer may prevent (or block) the fourth material from diffusion. Accordingly, degradation of interfaces between each layer may be prevented (or reduced) and increase in driving voltage may be prevented (or reduced), and thus, the light-emitting device may provide improved lifespan and/or brightness.

Second Electrode 190

The second electrode 190 is positioned on the n$^{th}$ light-emitting unit. The second electrode 190 may be a cathode, which is an electron injection electrode, and in this regard, a material for forming the second electrode 190 may be selected from a metal, an alloy, an electrically conductive compound, and combinations thereof, which have a relatively low work function.

The second electrode 190 may include at least one selected from lithium (Li), silver (Ag), magnesium (Mg), aluminum (Al), ytterbium (Yb), aluminum-lithium (Al—Li), calcium (Ca), magnesium-indium (Mg—In), silver-magnesium (Mg—Ag), silver-ytterbium (Ag—Yb), ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

A thickness of the second electrode 190 may be in a range of about 5 nm to about 20 nm. When the thickness of the second electrode 190 is satisfied within the range above, light absorption at the second electrode may be minimized (or reduced), and satisfactory (or suitable) electron injection characteristics may be obtained without a substantial increase in driving voltage.

Apparatus

The light-emitting device may be included in various suitable apparatuses. For example, a light-emitting apparatus, an authentication apparatus, and/or an electronic apparatus, which includes the light-emitting device, may be provided.

Light-Emitting Device

Figure 3:
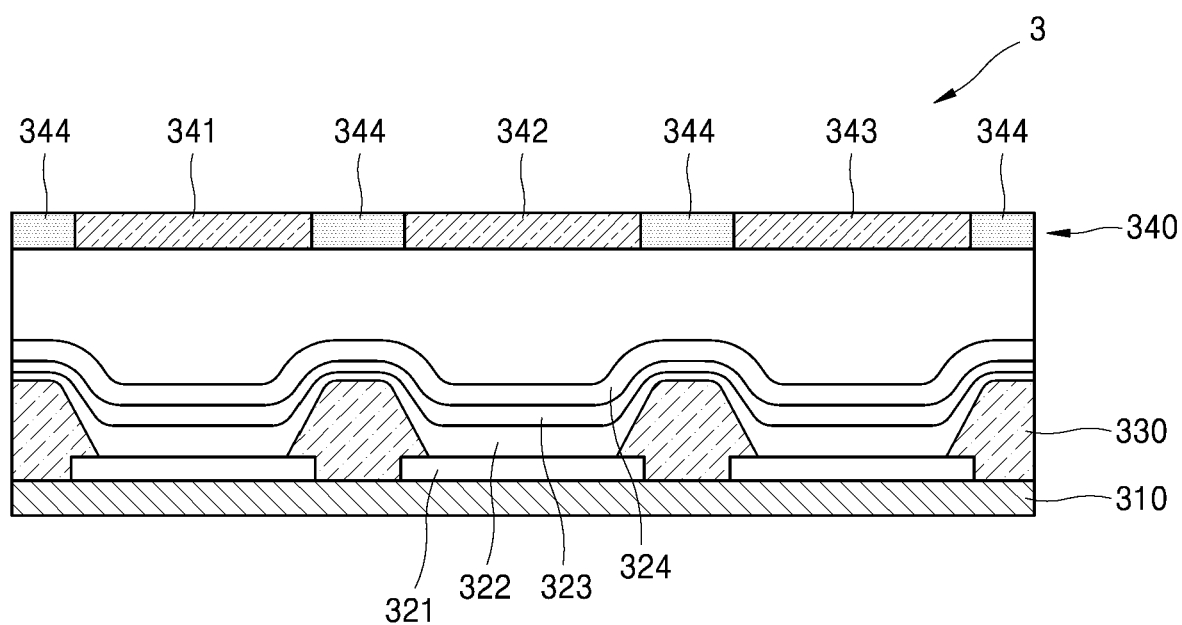
FIG. 3 is a schematic cross-sectional view of an apparatus including a light-emitting device according to an embodiment.

Referring to FIG. 3, a light-emitting device 3 according to an embodiment of the present disclosure will be described in more detail.

In the light-emitting apparatus 3, a color filter 340 may be located on at least one traveling direction of light emitted from the light-emitting device.

For example, the light-emitting device may include a first electrode 321, a first light-emitting unit 322, a first charge-generation unit, a second light-emitting unit 323, and a second electrode 324. For example, the first light-emitting unit 322 and the second light-emitting unit 323 may each emit blue light, but embodiments are not limited thereto.

A first substrate 310 of the light-emitting device may include a plurality of subpixel areas, and the color filter 340 may include a plurality of color filter areas 341, 342, and 343 respectively corresponding to the plurality of subpixel areas. A pixel-defining film 330 may be formed between the plurality of subpixel areas to define each of the subpixel areas. The color filter 340 may include light blocking patterns 344 between the plurality of color filter areas.

The plurality of color filter areas may include a first color filter area emitting (to emit) first color light, a second color filter area emitting (to emit) second color light, and a third color filter area emitting (to emit) third color light, and the first color light, the second color light, and the third color light may have different maximum emission wavelengths from one another. For example, the first color light may be red light, the second color light may be green light, and the third color light may be blue light, but embodiments are not limited thereto.

For example, each of the plurality of color filter areas may include a quantum dot, or only a part of the plurality of color filter areas may include a quantum dot.

In one embodiment, the first color filter area may include a red quantum dot, the second color filter area may include a green quantum dot, and the third color filter area may not include a quantum dot. In this case, the light-emitting device may emit first light, the first color filter area may absorb the first light to emit first first-color light, the second color filter area may absorb the first light to emit second first-color light, and the third color filter area may transmit the first light without any change. In this case, the first first-color light, the second first-color light, and the first light may have different maximum emission wavelengths from one another. For example, the first light may be blue light, the first first-color light may be red light, and the second first-color light may be green light, but embodiments are not limited thereto.

In another embodiment, the first color filter area may include a red quantum dot, the second color filter area may include a green quantum dot, and the third color filter area may include a blue quantum dot. In this case, the light-emitting device may emit first light, the first color filter area may absorb the first light to emit first first-color light, the second color filter area may absorb the first light to emit second first-color light, and the third color filter area may absorb the first light to emit third first-color light. In this case, the first first-color light, the second first-color light, and the third first-color light may have different maximum emission wavelengths from one another. For example, the first light may be blue light, the first first-color light may be red light, the second first-color light may be green light, and the third first-color light may be blue light, but embodiments are not limited thereto.

A quantum dot may be understood by referring to the description thereof provided herein.

Each of the first color filter area, the second color filter area, and the third color filter area may include one or more scatterers, but embodiments are not limited thereto.

The light-emitting device may further include, in addition to the light-emitting device, a thin-film transistor. The thin-film transistor may include a source electrode, a drain electrode, and an activation layer, and the source electrode or the drain electrode (e.g., the drain electrode) may be electrically connected to the first electrode or the second electrode (e.g., the first electrode) of the light-emitting device.

The thin-film transistor may further include a gate electrode, a gate insulation layer, and/or the like.

The active layer may include crystalline silicon, amorphous silicon, organic semiconductor, oxide semiconductor, and/or the like, but embodiments of the present disclosure are not limited thereto.

The light-emitting apparatus may further include a sealing part to seal the light-emitting device. The sealing part may be between the color filter and the light-emitting device. The sealing part may allow an image from the light-emitting device to be implemented, and may block (or reduce) outside air and moisture from penetrating into the light-emitting device. The sealing part may be a sealing substrate including a transparent glass and/or a plastic substrate. The sealing part may be a thin film encapsulation layer including a plurality of organic layers and/or a plurality of inorganic layers. When the sealing part is a thin-film encapsulation layer, the entire flat display apparatus may be flexible.

The light-emitting apparatus may be used as various suitable displays, light sources, and/or the like.

Authentication Apparatus

The authentication apparatus may be, for example, a biometric authentication apparatus to authenticate an individual by using biometric information of a biometric body (for example, a finger tip, a pupil, and/or the like).

The authentication apparatus may further include, in addition to the light-emitting device, a biometric information collector.

Electronic Apparatus

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, and/or endoscope displays), fish finders, various measuring instruments, meters (for example, meters for a vehicle, an aircraft, and/or a vessel), projectors, and/or the like, but embodiments of the present disclosure are not limited thereto.

Preparation Method

Layers included in the light-emitting unit and layers constituting the charge-generating unit may be formed in a certain region by using one or more suitable methods selected from vacuum deposition, spin coating, casting, Langmuir-Blodgett (LB) deposition, ink-jet printing, laser-printing, and laser-induced thermal imaging.

When layers included in the light-emitting unit and layers constituting the charge-generating unit are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, by taking into account a material to be included in a layer to be formed, and the structure of a layer to be formed.

When layers included in the light-emitting unit and layers constituting the charge-generating unit are formed by spin coating, the spin coating may be performed at a coating speed of about 2,000 rpm to about 5,000 rpm and at a heat treatment temperature of about 80° C. to 200° C., by taking into account a material to be included in a layer to be formed, and the structure of a layer to be formed.

General Definition of Substituents

The term "$C_1$-$C_{60}$ alkyl group" as used herein refers to a linear or branched aliphatic saturated hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in, for example, the middle and/or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in, for example, the middle and/or at the terminus of the $C_2$-$C_{60}$ alkyl group, and non-limiting examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom, and 1 to 10 carbon atoms as the remaining ring-forming atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms as the remaining ring-forming atoms, and at least one carbon-carbon double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. The term "$C_6$-$C_{60}$ arylene group" used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective rings may be fused to each other.

The term "$C_1$-$C_{60}$ heteroaryl group" as used herein refers to a monovalent group having a carbocyclic aromatic system that has at least one heteroatom selected from N, O, Si, P, and S as a ring-forming atom, in addition to 1 to 60 carbon atoms as the remaining ring-forming atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. The term "$C_1$-$C_{60}$ heteroarylene group" as used herein refers to a divalent group having the same structure as the $C_1$-$C_{60}$ heteroaryl group. When the $C_1$-$C_{60}$ heteroaryl group and the $C_1$-$C_{60}$ heteroarylene group each independently include two or more rings, the respective rings may be condensed (fused) with each other.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$C_1$-$C_{60}$ heteroaryloxy group" as used herein refers to a monovalent group represented by —$OA_{104}$ (wherein $A_{104}$ is the $C_1$-$C_{60}$ heteroaryl group), and the term "$C_1$-$C_{60}$heteroarylthio group" as used herein refers to —$SA_{105}$ (wherein $A_{105}$ is the $C_1$-$C_{60}$ heteroaryl group).

The term "monovalent non-aromatic condensed polycyclic group" as used herein refers to a monovalent group having two or more rings condensed with each other, only carbon atoms as ring-forming atoms (for example, having 8 to 60 carbon atoms), and no aromaticity in its entire molecular structure (e.g., the molecular structure as a whole does not have aromaticity). A non-limiting example of the monovalent non-aromatic condensed polycyclic group is a fluorenyl group. The term "divalent non-aromatic condensed polycyclic group" as used herein refers to a divalent group having the same structure as that of the monovalent non-aromatic condensed polycyclic group.

The term "monovalent non-aromatic condensed heteropolycyclic group" as used herein refers to a monovalent group having two or more rings condensed to each other, at least one heteroatom selected from N, O, Si, P, and S, other than carbon atoms (for example, 1 to 60 carbon atoms), as a ring-forming atom, and no aromaticity in its entire molecular structure (e.g., the molecular structure as a whole does not have aromaticity). A non-limiting example of the monovalent non-aromatic condensed heteropolycyclic group is a carbazolyl group. The term "divalent non-aromatic condensed heteropolycyclic group" as used herein refers to a divalent group having the same structure as that of the monovalent non-aromatic condensed heteropolycyclic group.

The term "$C_5$-$C_{60}$ carbocyclic group" as used herein refers to a monocyclic or polycyclic group having 5 to 60 carbon atoms in which ring-forming atoms are carbon atoms only. The term "$C_5$-$C_{60}$ carbocyclic group" as used herein refers to an aromatic carbocyclic group or a non-aromatic carbocyclic group. The $C_5$-$C_{60}$ carbocyclic group may be a ring (such as benzene), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used in addition to carbon atoms (the number of carbon atoms may be in a range of 1 to 60).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, the term "OMe" as used herein refers to a methoxy group, and "D" refers to deuterium.

The term "biphenyl group" as used herein refers to "a phenyl group substituted with a phenyl group". For example, the "biphenyl group" may be a substituted phenyl group having a $C_6$-$C_{60}$ aryl group as a substituent.

The term "terphenyl group" as used herein refers to "a phenyl group substituted with a biphenyl group". For example, the "terphenyl group" may be a phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, an organic light-emitting device according to an embodiment will be described in more detail with reference to Synthesis Examples and Examples.

EXAMPLES

Example 1

A 15 Ωcm² (1,200 Å) ITO/Ag/ITO glass substrate (a product of Corning Inc.) with was cut to a size of 50 mm×50 mm×0.7 mm, and sonicated using isopropyl alcohol and pure water for 5 minutes each, and then irradiated with ultraviolet light for 30 minutes and exposed to ozone for cleaning. Then, the resultant glass substrate was loaded onto a vacuum deposition apparatus.

HAT-CN and CuI were co-deposited at a volume ratio of 97:3 on the ITO/Ag/ITO anode on the glass substrate to form a hole injection layer having a thickness of 10 nm, NPB was deposited on the hole injection layer to form a first hole transport layer having a thickness of 240 nm, TCTA was deposited on the first hole transport layer to form a second hole transport layer having a thickness of 5 nm, H18 and FD23 were co-deposited at a volume ratio of 98:2 on the second hole transport layer to form an emission layer having a thickness of 17 nm, a first electron transport layer having a thickness of 5 nm was formed on the emission layer by using T2T, and TPM-TAZ and Liq were co-deposited at a volume ratio of 1:1 on the first electron transport layer to form a second electron transport layer having a thickness of 25 nm, and thereby, a first light-emitting unit was formed.

ET37 and Li were co-deposited at a volume ratio of 99:1 on the first light-emitting unit to form an n-type charge-generation layer having a thickness of 10 nm, HAT-CN were deposited to form an interlayer having a thickness of 5 nm, and HT3 and CuI were co-deposited at a volume ratio of 95:5 on the interlayer to form a p-type charge-generation layer having a thickness of 100 nm, and thereby a first charge-generation unit was formed.

NPB was deposited on the first charge-generation unit to form a first hole transport layer having a thickness of 54 nm, TCTA was deposited on the first hole transport layer to form a second hole transport layer having a thickness of 5 nm, H18 and FD23 were co-deposited at a volume ratio of 98:2 on the second hole transport layer to form an emission layer having a thickness of 17 nm, a first electron transport layer having a thickness of 5 nm was formed on the emission layer by using T2T, and TPM-TAZ and Liq were co-deposited at a volume ratio of 1:1 on the first electron transport layer to form a second electron transport layer having a thickness of 25 nm, and thereby a second light-emitting unit was formed.

ET37 and Li were co-deposited at a volume ratio of 99:1 on the second light-emitting unit to form an n-type charge-generation layer having a thickness of 10 nm, HAT-CN was deposited to form an interlayer having a thickness of 5 nm, and HT3 and CuI were co-deposited at a volume ratio of 95:5 on the interlayer to form a p-type charge-generation layer having a thickness of 100 nm, and thereby a second charge-generation unit was formed.

NPB was deposited on the second charge-generation unit to form a first hole transport layer having a thickness of 44.5 nm, TCTA was deposited on the first hole transport layer to form a second hole transport layer having a thickness of 5 nm, H18 and FD23 were co-deposited at a volume ratio of 98:2 on the second hole transport layer to form an emission layer having a thickness of 17 nm, a first electron transport layer having a thickness of 5 nm was formed on the emission layer by using T2T, TPM-TAZ and Liq were co-deposited at a volume ratio of 1:1 on the first electron transport layer to form a second electron transport layer having a thickness of 35 nm, and KI and Yb were co-deposited at a volume ratio of 95:5 on the second electron transport layer to form an electron injection layer having a thickness of 1.1 nm, and thereby a third light-emitting unit was formed.

Ag and Mg were co-deposited at a volume ratio of 9:1 on the third light-emitting unit to form a cathode having a thickness of 14 nm, and thereby, a tandem light-emitting device was manufactured.

Comparative Example 1

An light-emitting device was manufactured by using substantially the same method as Example 1, except that HAT-CN was deposited as the p-type charge-generation layer, and an interlayer was not formed.

Comparative Example 2

An light-emitting device was manufactured by using substantially the same method as Example 1, except that the interlayer was not formed.

Evaluation Example 1

The driving voltage, change in the driving voltage, current efficiency, lifespan, and CIE color coordinates of the light-emitting devices manufactured according to Examples 1 and Comparative Examples 1 and 2 were measured by using Keithley SMU 236 and a luminance photometer PR650, and results thereof are shown in Table 1. The lifespan (T97) is a period of time that was taken until the brightness (@400 nit) was reduced to 97% of initial brightness (100%) after the light-emitting was driven. The change in the driving voltage is a difference between the initial driving voltage and the driving voltage measured 500 hours after the light-emitting device was driven.

TABLE 1

| | Charge-generation unit | | | Driving voltage | Change in driving voltage | Current efficiency | Lifespan $(T_{97})$ | Color coordinates |
|---|---|---|---|---|---|---|---|---|
| | p-CGL | interlayer | n-CGL | (V) | (V) | (cd/A) | (hours) | (y) |
| Example 1 | HT3:CuI | HAT-CN | ET37:Li | 10.7 | 0.07 | 36.7 | 970 | 0.124 |
| Comparative Example 1 | HAT-CN | none | ET37:Li | 13.6 | 1.2 | 34.2 | 550 | 0.126 |
| Comparative Example 2 | HT3:CuI | none | ET37:Li | 15.2 | 2.3 | 33.1 | 320 | 0.127 |

From the results shown in Table 1, it was confirmed that the light-emitting device of Example 1 may have improved efficiency and lifespan compared to the light-emitting devices of Comparative Examples 1 and 2 and, in particular, may have significantly improved lifespan.

The light-emitting device may have low degradation and high stability even in a high voltage and/or high temperature environment.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A light-emitting device comprising:
a first electrode;
a second electrode facing the first electrode;
light-emitting units in the number of n between the first electrode and the second electrode; and
a charge-generation unit(s) in the number of n−1 between the adjacent light-emitting units,
wherein n is a natural number of 2 or more,
the light-emitting units each comprise an emission layer,
at least one of the charge-generation unit(s) comprises an n-type charge-generation layer, a p-type charge-generation layer, and an interlayer between the n-type charge-generation layer and the p-type charge-generation layer,
the p-type charge-generation layer comprises a first material and a second material,
the first material comprises a hole-transporting organic compound, an inorganic insulation compound, or any combination thereof,
the second material comprises at least one inorganic semiconductor compound, and
the interlayer consists of a third material, the third material being at least one selected from a quinone derivative, 1,4,5,8,9,11-hexaazatriphenylene-hexacarbonitrile (HAT-CN), and a compound represented by Formula 221:

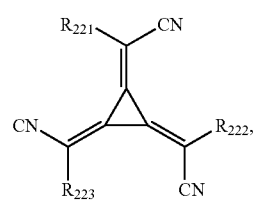

Formula 221 wherein in Formula 221,
each of $R_{221}$ to $R_{223}$ is independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and
wherein at least one selected from $R_{221}$ to $R_{223}$ has at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

2. The light-emitting device of claim 1, wherein the first material is equal to or greater in volume than the second material.

3. The light-emitting device of claim 1, wherein the first material comprises a hole-transporting organic compound, and a volume ratio of the first material to the second material is in a range of about 99:1 to about 80:20, or
the first material comprises an inorganic insulation compound, and a volume ratio of the first material to the second material is in a range of about 99:1 to about 50:50.

4. The light-emitting device of claim 1, wherein a band gap of the third material is about 2.5 eV or more.

5. The light-emitting device of claim 1, wherein a lowest unoccupied molecular orbital (LUMO) energy level of the third material is about −4.5 eV to about −6.5 eV.

6. The light-emitting device of claim 1, wherein the n-type charge-generation layer comprises a first fourth material and a fifth material,
the fourth material comprises an alkali metal, an alkaline earth metal, a lanthanoid metal, a transition metal, a late transition metal, or any combination thereof, and
the fifth material comprises at least one electron-transporting organic compound.

7. The light-emitting device of claim 6, wherein a LUMO energy level of the fifth material is smaller than a LUMO energy level of the third material.

8. The light-emitting device of claim 6, wherein a difference between a LUMO energy level of the fifth material and a LUMO energy level of the third material is about 1 eV or less.

9. The light-emitting device of claim 1, wherein the first electrode is an anode,
the second electrode is a cathode, and
the light-emitting unit comprises:
an $n^{th}$ light-emitting unit between the first electrode and the second electrode;
an $n-1^{th}$ light-emitting unit between the first electrode and the $n^{th}$ light-emitting unit; and
an $n-1^{th}$ charge-generation unit between the $n^{th}$ light-emitting unit and the $n-1^{th}$ light-emitting unit,
wherein the $n^{th}$ light-emitting unit comprises an $n^{th}$ emission layer,
the $n-1^{th}$ light-emitting unit comprises an $n-1^{th}$ emission layer;
an $n-1^{th}$ hole transport region is between the first electrode and the $n-1^{th}$ emission layer;
an $n-1^{th}$ electron transport region is between the $n-1^{th}$ emission layer and the $n-1^{th}$ charge-generation unit;
an $n^{th}$ hole transport region is between the n−1th charge-generation unit and the $n^{th}$ emission layer; and
an $n^{th}$ electron transport region is between the $n^{th}$ emission layer and the second electrode,
wherein the plurality of hole transport regions each independently comprise a hole injection layer, a hole transport layer, an electron blocking layer, or any combination thereof, and
the plurality of electron transport regions each independently comprise a hole blocking layer, an electron transport layer, an electron injection layer, or any combination thereof.

10. The light-emitting device of claim 9, wherein the hole injection layer comprises a sixth material and a seventh material,
the sixth material and the seventh material are different from each other,
the sixth material comprises a halide of a lanthanoid metal, a halide of a transition metal, a halide of a late transition metal, tellurium, a telluride of a lanthanoid metal, a telluride of a transition metal, a telluride of a late transition metal, a selenide of a lanthanoid metal, a selenide of a transition metal, a selenide of a late transition metal, or any combination thereof, and
the seventh material comprises a hole-transporting organic compound, a halide of an alkali metal, a halide of an alkaline earth metal, a halide of a lanthanoid metal, or any combination thereof.

11. The light-emitting device of claim 10, wherein the seventh material comprises at least one hole-transporting organic compound, and a volume ratio of the sixth material to the seventh material is in a range of about 1:99 to about 20:80, or
the seventh material comprises a halide of an alkali metal, a halide of an alkaline earth metal, a halide of a lanthanoid metal, or any combination thereof, and a volume ratio of the sixth material to the seventh material is in a range of about 1:99 to about 50:50.

12. The light-emitting device of claim 9, wherein the electron injection layer comprises an eighth material, and
the eighth material comprises a halide of an alkali metal, a halide of an alkaline earth metal, a halide of a lanthanoid metal, or any combination thereof.

13. The light-emitting device of claim 12, wherein the electron injection layer consists of the eighth material.

14. The light-emitting device of claim 12, wherein the electron injection layer further comprises a ninth material,
the eighth material and the ninth material are different from each other, and
the ninth material comprises an alkali metal, an alkaline earth metal, a lanthanoid metal, or any combination thereof.

15. The light-emitting device of claim 14, wherein the eighth material is represented by Formula X, and the ninth material is represented by Formula Y:

$$A_n B_m \quad \text{Formula X}$$

$$C, \quad \text{Formula Y}$$

wherein, in Formulae X and Y,
A and C each independently comprise an alkali metal, an alkaline earth metal, a lanthanoid metal, or any combination thereof,
B is a halogen,
n and m are each independently an integer of 1 or more, to make the eighth material neutral, and
A and C are different from each other.

16. The light-emitting device of claim 9, wherein
the hole transport layer is in direct contact with the emission layer,
the hole transport layer comprises a tenth material and an eleventh material,
the tenth material and the eleventh material are different from each other,
the tenth material comprises at least one hole-transporting organic compound, and
the eleventh material comprises a halide of an alkali metal, a halide of an alkaline earth metal, a halide of a lanthanoid metal, or any combination thereof.

17. The light-emitting device of claim 9, wherein the electron transport layer is in direct contact with the emission layer,
the electron transport layer comprises a twelfth material and a thirteenth material,
the twelfth material and the thirteenth material are different from each other,
the twelfth material comprises at least one electron-transporting organic compound, and
the thirteenth material comprises a halide of an alkali metal, a halide of an alkaline earth metal, a halide of a lanthanoid metal, or any combination thereof.

* * * * *